United States Patent
Huang et al.

(10) Patent No.: US 10,692,742 B2
(45) Date of Patent: Jun. 23, 2020

(54) OPERATING METHOD OF MICROWAVE HEATING DEVICE AND MICROWAVE ANNEALING PROCESS USING THE SAME

(71) Applicant: Industrial Technology Research Institute, Hsinchu (TW)

(72) Inventors: Kun-Ping Huang, Miaoli County (TW); Jwu-Sheng Hu, Hsinchu County (TW); Chih-Chen Chang, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 245 days.

(21) Appl. No.: 15/854,802

(22) Filed: Dec. 27, 2017

(65) Prior Publication Data

US 2018/0122663 A1    May 3, 2018

Related U.S. Application Data

(63) Continuation-in-part of application No. 14/983,600, filed on Dec. 30, 2015, now Pat. No. 10,231,293.

(30) Foreign Application Priority Data

Nov. 5, 2015 (TW) .............................. 104136460 A
Sep. 29, 2017 (TW) .............................. 106133483 A

(51) Int. Cl.
*H05B 6/70* (2006.01)
*H01L 21/67* (2006.01)
(Continued)

(52) U.S. Cl.
CPC .... *H01L 21/67115* (2013.01); *H01L 21/2686* (2013.01); *H01L 21/324* (2013.01);
(Continued)

(58) Field of Classification Search
CPC .. H05B 6/6402; H05B 6/6411; H05B 6/6455; H05B 6/6464; H05B 6/66; H05B 6/664;
(Continued)

(56) References Cited

U.S. PATENT DOCUMENTS 2,215,521 A    9/1940   Finch
3,977,089 A    8/1976   Forster et al.
(Continued)

FOREIGN PATENT DOCUMENTS

CN    101529710    9/2009
CN    103021821    4/2013
(Continued)

OTHER PUBLICATIONS

Fong et al., "Crystallization of amorphous Si film by microwave annealing with SiC susceptors", Applied Physics Letters, Mar. 10, 2009, pp. 102104-1-102104-3.
(Continued)

*Primary Examiner* — Hung D Nguyen
(74) *Attorney, Agent, or Firm* — JCIPRNET

(57) ABSTRACT

An operating method of microwave heating device is provided, in which a holder is disposed in a heating chamber, and a plurality of microwave transmitters are arranged outside the heating chamber. A plurality of half-wave-rectified power supplies are provided to connect the microwave transmitters, and the half-wave-rectified power supplies have capacitances respectively. A plurality of longitudinal waveguides and a plurality of transverse waveguides are installed in between the heating chamber and the microwave transmitters. The capacitance of each of the capacitors of the half-wave-rectified power supplies is adjusted, such that the microwave power pulse bandwidth of the microwave transmitters are extended to produce a plurality of overlapped couplings. The half-wave-rectified
(Continued)

power supplies supply power to the microwave transmitters, so that the microwaves are guided into the heating chamber by the longitudinal waveguides and the transverse waveguides for exciting multiple microwave modes in the heating chamber.

29 Claims, 16 Drawing Sheets

(51) Int. Cl.
| | |
|---|---|
| H05B 6/66 | (2006.01) |
| H05B 6/68 | (2006.01) |
| H01L 21/268 | (2006.01) |
| H05B 6/72 | (2006.01) |
| H01L 21/324 | (2006.01) |

(52) U.S. Cl.
CPC ....... *H01L 21/67248* (2013.01); *H05B 6/664* (2013.01); *H05B 6/686* (2013.01); *H05B 6/707* (2013.01); *H05B 6/72* (2013.01)

(58) Field of Classification Search
CPC .......... H05B 6/686; H05B 6/70; H05B 6/704; H05B 6/705; H05B 6/707; H05B 6/708; H05B 6/72; H05B 6/725; H05B 6/74; H05B 6/80; H01L 21/2686; H01L 21/324; H01L 21/67115; H01L 21/67248; H01L 21/6776
USPC ....... 219/678, 690, 691, 692, 693, 695, 696, 219/697, 700, 701, 702, 705, 715, 717, 219/718, 746, 752, 753, 762
See application file for complete search history.

(56) References Cited

U.S. PATENT DOCUMENTS

| | | | |
|---|---|---|---|
| 4,104,561 A | | 8/1978 | Iwata |
| 4,631,380 A | * | 12/1986 | Tran ..................... A22C 11/006 |
| | | | 219/697 |
| 4,683,387 A | | 7/1987 | Jones et al. |
| 4,771,156 A | * | 9/1988 | Strattan ................ H05B 6/6458 |
| | | | 219/762 |
| 5,321,222 A | | 6/1994 | Bible et al. |
| 5,721,286 A | | 2/1998 | Lauf et al. |
| 5,834,744 A | * | 11/1998 | Risman .................. H05B 6/681 |
| | | | 219/697 |
| 5,961,871 A | | 10/1999 | Bible et al. |
| 7,208,710 B2 | | 4/2007 | Gregoire et al. |
| 7,928,021 B2 | | 4/2011 | Kowalski et al. |
| 8,114,748 B2 | | 2/2012 | Lee et al. |
| 8,866,271 B2 | | 10/2014 | Yamamoto et al. |
| 8,907,259 B2 | | 12/2014 | Kasai et al. |
| 9,018,110 B2 | | 4/2015 | Stowell et al. |
| 2005/0127068 A1 | * | 6/2005 | Tang ..................... H05B 6/701 |
| | | | 219/700 |
| 2006/0102621 A1 | | 5/2006 | Gregoire et al. |
| 2008/0272114 A1 | | 11/2008 | Taguchi et al. |
| 2009/0166355 A1 | | 7/2009 | Brundage et al. |
| 2013/0075390 A1 | | 3/2013 | Ashida |
| 2014/0103031 A1 | | 4/2014 | Peelamedu |
| 2015/0090708 A1 | | 4/2015 | Tanaka et al. |
| 2015/0305097 A1 | | 10/2015 | Ashida et al. |
| 2016/0209114 A1 | | 7/2016 | Fu et al. |
| 2017/0135163 A1 | | 5/2017 | Chang et al. |

FOREIGN PATENT DOCUMENTS

| | | |
|---|---|---|
| CN | 103999547 | 8/2014 |
| CN | 105790630 | 7/2016 |
| CN | 106042235 | 10/2016 |
| JP | 2009301764 | 12/2009 |
| TW | 208108 | 6/1993 |
| TW | 384506 | 3/2000 |
| TW | 200937531 | 9/2009 |
| TW | I347029 | 8/2011 |
| TW | 201526713 | 7/2015 |
| TW | I568316 | 1/2017 |
| TW | 201717699 | 5/2017 |

OTHER PUBLICATIONS

Teng et al., "Effects of microwave annealing on electrical enhancement of amorphous oxide semiconductor thin film transistor", Applied Physics Letters, Sep. 24, 2012, pp. 132901-1-132901-4.
Sundaresan et al., "Comparison of Solid-State Microwave Annealing with Conventional Furnace Annealing of Ion-Implanted SiC", Journal of Electronic Materials, Feb. 6, 2007, pp. 324-331.
Jin et al., "Deconvoluting the Mechanism of Microwave Annealing of Block Copolymer Thin Films", ACS Nano, Mar. 21, 2014, pp. 3979-3991.
Bhaskar et al., "Effect of microwave annealing temperatures on lead zirconate titanate thin films", Nanotechnology, Sep. 4, 2007, pp. 1-7.
Nipoti et al., "Microwave Annealing of Very High Dose Aluminum-Implanted 4H-SiC", Applied Physics Express, Oct. 19, 2011, pp. 111301-1-111301-3.
Sundaram Gunasekaran, et al., "Effect of experimental parameters on temperature distribution during continuous and pulsed microwave heating", Journal of Food Engineering, Mar. 3, 2006, pp. 1452-1456.
Juming Tang, "Unlocking Potentials of Microwaves for Food Safety and Quality", Journal of Food Science, Aug. 2015, pp. 1776-1793.
Sadatsugu Takayama et al., "Sintering of Soft Magnetic Material under Microwave Magnetic Field", Physics Research International, Jan. 2012, pp. 1-5.
Gaston P. Barreto et al., "Microwave Assisted Synthesis of ZnO Nanoparticles: Effect of Precursor Reagents, Temperature, Irradiation Time, and Additives on Nano-ZnO Morphology Development", Journal of Materials, Mar. 2013, pp. 1-12.
Svein Jacobsen et al., "Dual-Mode Antenna Design for Microwave Heating and Noninvasive Thermometry of Superficial Tissue Disease", IEEE Transactions on Biomedical Engineering, Nov. 2000, pp. 1500-1509.
Konstantin A. Lurie et al., "Method of Control and Optimization of Microwave Heating in Waveguide Systems", IEEE Transaction on Magnetics, May 1999, pp. 1777-1780.
"Office Action of Taiwan Counterpart Application", dated Jun. 15, 2018, p. 1-p. 3.

\* cited by examiner

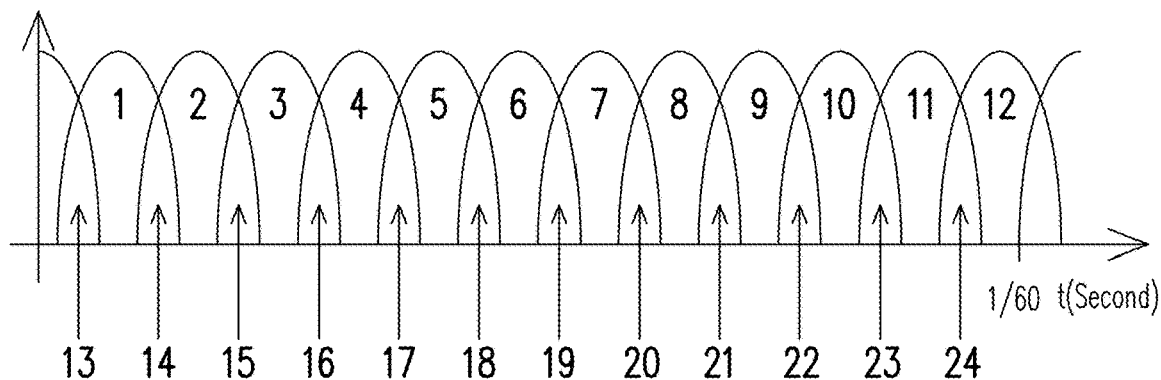
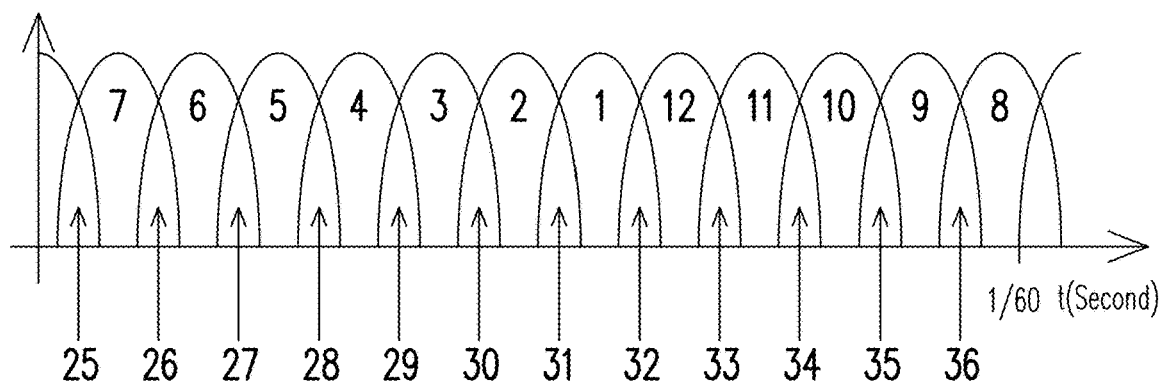
FIG. 1B-5
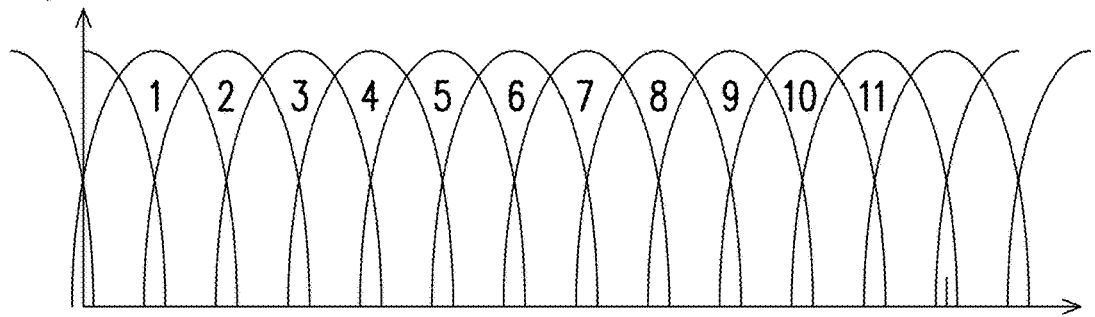
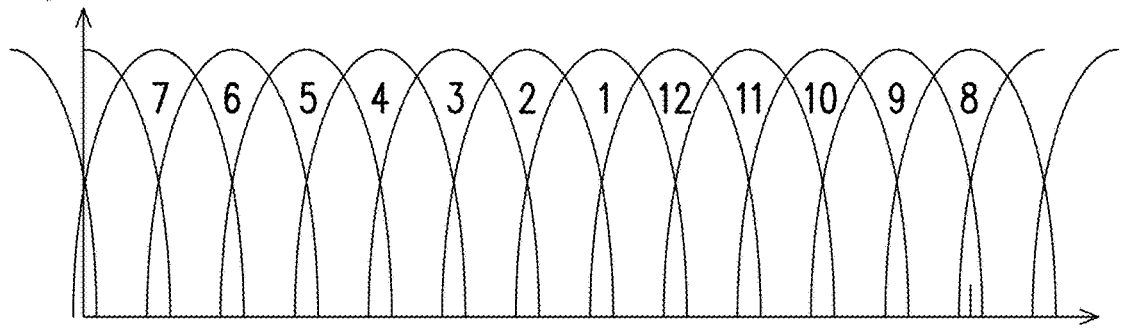
FIG. 1B-6

OPERATING METHOD OF MICROWAVE HEATING DEVICE AND MICROWAVE ANNEALING PROCESS USING THE SAME

CROSS-REFERENCE TO RELATED APPLICATION

This application is a continuation-in-part of and claims the priority benefit of U.S. application Ser. No. 14/983,600, filed on Dec. 30, 2015, now pending, which claims the priority benefit of Taiwan application serial no. 104136460, filed on Nov. 5, 2015. This application also claims the priority benefit of Taiwan application serial no. 106133483, filed on Sep. 29, 2017. The entirety of each of the above-mentioned patent applications is hereby incorporated by reference herein and made a part of this specification.

TECHNICAL FIELD

The disclosure is related to an operating method of microwave heating device and a microwave annealing process using the method; more particularly, the disclosure is related to a coupling-mode operation method by adjusting the value of the capacitance of the half-wave-rectified power supply, such that the microwave power pulse bandwidth of the microwave transmitters are extended to produce a plurality of overlapped couplings, thereby multiplying microwave mode numbers so as to achieve uniform microwave heating.

BACKGROUND

Microwave heating technology has not only been applied in conventional industries (e.g., for dehydration of wood or brewers' yeast, for vulcanization of rubber, for thawing meat, and so on) but also been applied in semiconductor industries, e.g., for annealing silicon wafers. Semiconductor manufactural process contains hundreds of processes and each of them poses impacts on the production capacity and the yield of the silicon wafers.

Here, the wafer annealing process is required to be performed after ion implantation. When three-valance or five-valance elements are implanted into a four-valance semiconductor, the issue of lattice defects is likely to arise, such that the properties of the semiconductor are drastically changed; hence, the anneal step should be performed to recover the lattice structure, remove lattice defects, and move impurity atoms from an interstitial site to a substitution site through anneal, so as to activate electrical properties. Due to the issues for continuous shrink of interface thickness and line width in semiconductor devices, some types of anneal, such as infrared anneal or far-ultraviolet laser anneal, have been facing the bottlenecks caused by the issues aforesaid; however, microwave annealing process is not subject to the aforementioned requirements.

However, the technical barrier of microwave anneal lies in the strict requirement for anneal uniformity, i.e., high yield. The microwave frequency adopted by the already commercialized microwave anneal equipment is usually using 5.8 GHz or higher rather than 2.45 GHz (the common industrial microwave frequency). Shrink in wavelength of commercialized microwave anneal equipment leads to suppression of standing-wave effects and thus achieves uniform annealed results. However, compared to the 2.45 GHz magnetron, the 5.8 GHz magnetron has higher costs but lower efficiency. Hence, a multi-mode microwave heating (annealing) device for microwave annealing process on silicon wafers or other to-be-heated objects is provided herein. The multi-mode microwave heating (annealing) device usually uses (but not subject to use) the common industrial heating frequency of 2.45 GHz, which is sufficient to increase the microwave heating efficiency and uniformity and further improves the production capacity as well as the yield of the to-be-heated objects.

SUMMARY

The disclosure provides an operating method of microwave heating device and a microwave annealing process using the method, applying common industrial heating frequency of 2.45 GHz or other bands of frequency, is capable of multiplying microwave mode numbers in the heating chamber, such that both efficient and uniform microwave heating is achieved.

In an embodiment of the disclosure, an operating method of microwave heating device comprising the following steps. Provide a heating chamber having an accommodation space in which a holder disposed, and the holder has a plane. Arrange a plurality of microwave transmitters outside the heating chamber to transmit microwave into the heating chamber. Provide a plurality of half-wave-rectified power supplies to connect the microwave transmitters, and the half-wave-rectified power supplies have capacitances respectively. Install a plurality of longitudinal waveguides and a plurality of transverse waveguides in between the heating chamber and the microwave transmitters, and the directions of electric field polarization of the longitudinal waveguides are perpendicular to the plane of the holder, and the directions of electric field polarization of the transverse waveguides are parallel to the plane of the holder. Adjust the value of the capacitance of half-wave-rectified power supply. Supply power to the microwave transmitters by the half-wave-rectified power supplies so that the microwaves are guided into the heating chamber by the longitudinal waveguides and the transverse waveguides for exciting multiple microwave modes in the heating chamber.

The disclosure further provide a microwave annealing process applying to a semiconductor device having dopant substance and a manufactural process of a multi-mode microwave heating device, using common industrial heating frequency of 2.45 GHz or other bands of frequency, are capable of multiplying microwave mode numbers in the heating chamber, such that both efficient and uniform microwave heating is achieved.

In an embodiment of the disclosure, a microwave annealing process applying to a semiconductor device having dopant substance comprising the following steps. Provide a microwave heating device that includes a heating chamber arranged with an accommodation space in which a holder is disposed. The holder has a plane for holding the semiconductor device having dopant substance. Adjust the value of the capacitance of half-wave-rectified power supply. Supply power to the microwave transmitters by the half-wave-rectified power supplies so that the microwaves are guided into the heating chamber by the longitudinal waveguides and the transverse waveguides for exciting multiple microwave modes in the heating chamber, so as to apply microwave annealing process to the semiconductor device having dopant substance.

In an embodiment of the disclosure, a manufactural process of a multi-mode microwave heating device comprises the following steps. Provide a microwave heating device. Adjust the value of the capacitance of half-wave-rectified power supply such that the microwave power pulse bandwidth of the microwave transmitters are extended to produce a plurality of overlapped couplings, thereby multiplying microwave mode numbers. Supply power to the microwave transmitters by the half-wave-rectified power supplies so that the microwaves are guided into the heating chamber by the longitudinal waveguides and the transverse waveguides for exciting multiple microwave modes in the heating chamber.

In view of the above, by adjusting the value of the capacitance of the half-wave-rectified power supply such that the microwave power pulse bandwidth of the microwave transmitters are extended to produce a plurality of overlapped couplings, the operation method of the disclosure produces multiplying microwave mode numbers; next, supply power to the microwave transmitters by the half-wave-rectified power supplies so that the microwaves are guided into the heating chamber by the longitudinal waveguides and the transverse waveguides for exciting multiple microwave modes in the heating chamber, so as to achieve uniform microwave heating.

Several exemplary embodiments accompanied with figures are described in detail below to further describe the disclosure.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1B-1, FIG. 1B-2, FIG. 1B-3, FIG. 1B-4, FIG. 1B-5 and FIG. 1B-6 are schematic views illustrating arrangement of a power circuit of the multi-mode microwave heating device according to the first embodiment of the disclosure.

FIG. 4 is a schematic view illustrating a multi-mode microwave heating device according to the fourth embodiment of the disclosure.

FIG. 5 is a schematic diagram illustrating steps of an operating method applying to a microwave heating device according to the fifth embodiment of the disclosure.

FIG. 6 is a schematic diagram illustrating steps of a microwave annealing process of a semiconductor device having dopant substance according to the sixth embodiment of the disclosure.

DESCRIPTION OF THE EMBODIMENTS

Figures 1, 1A:
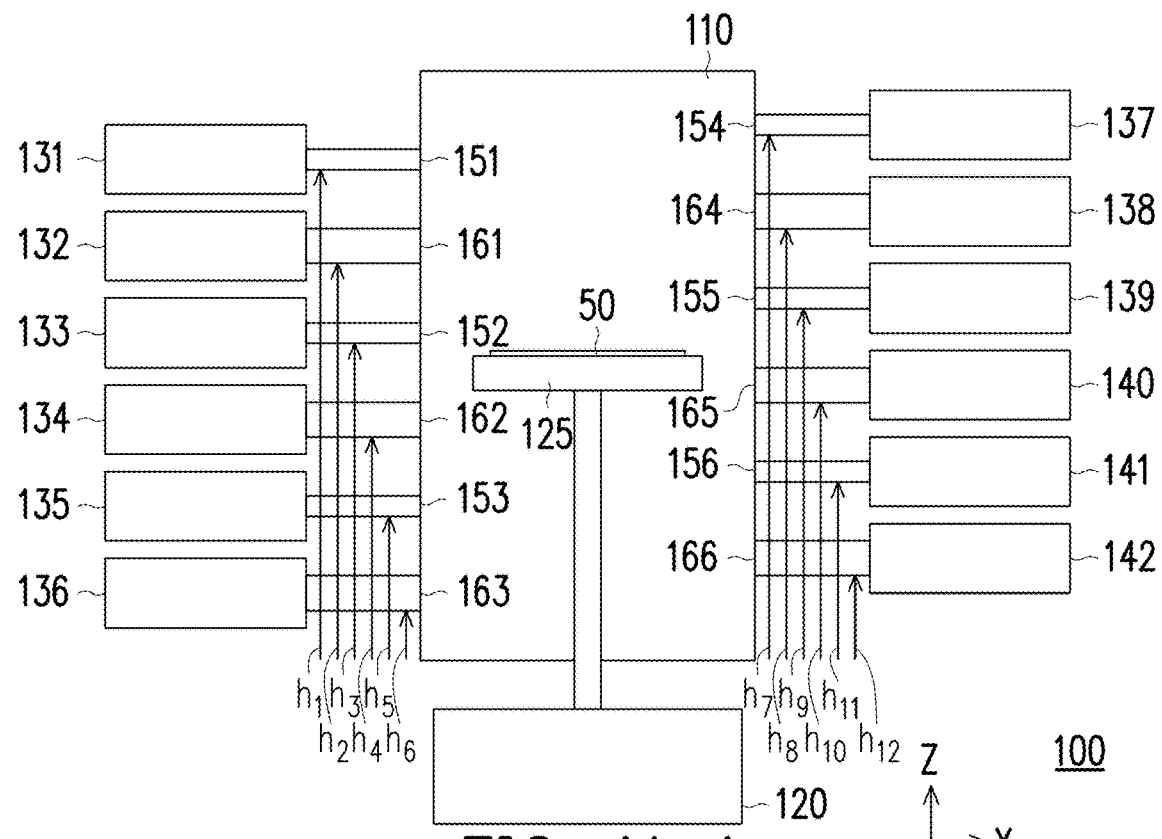
FIG. 1A-1 and FIG. 1A-2 are schematic views illustrating a multi-mode microwave heating device according to a first embodiment of the disclosure.

A description accompanied with drawings is provided in the following to sufficiently explain embodiments of the disclosure. However, it is noted that the disclosure may still be implemented in many other different forms and should not be construed as limited to the embodiments described hereinafter. In the drawings, for the purpose of clarity and specificity, the sizes and the relative sizes of each layer and region may not be illustrated in accurate proportion.

FIG. 1A-1 is a schematic view illustrating a multi-mode microwave heating device according to a first embodiment of the disclosure. With reference to FIG. 1A-1, the multi-mode microwave heating device 100 has six longitudinal waveguides 151-156 and six transverse waveguides 161-166 respectively connected between a heating chamber 110 and twelve microwave transmitters 131-142 for transmitting microwaves generated by the microwave transmitters 131-142 to the inside of the heating chamber 110 and exciting cavity modes in the heating chamber 110. The multi-mode microwave heating device 100 has a holder 125 arranged in the heating chamber 110 to hold a to-be-heated object 50. In the present embodiment, the holder 125 moves up and down and rotates through a rotating and elevating mechanism 120. The guided mode of the longitudinal waveguides 151-156 is a rectangular $TE_{10}$ mode, and the direction of electric field in the longitudinal waveguides 151-156 is perpendicular to a plane (the x-y plane) of the holder 125. The guided mode of the transverse waveguides 161-166 is the rectangular $TE_{10}$ mode as well, but the direction of the electric field in the transverse waveguides 161-166 is parallel to the plane of the holder 125. The directions of electric field respectively in the longitudinal waveguides 151-156 and the transverse waveguides 161-166 are perpendicular; hence, the cavity modes excited by the six longitudinal waveguides 151-156 and the cavity modes excited by the six transverse waveguides 161-166 are orthogonal. Besides, the junctions between the heating chamber 110 and the six longitudinal waveguides 151-156 are located at different positions of the heating chamber 110, and thus heights $h_1$, $h_3$, $h_5$, $h_7$, $h_9$, and $h_{11}$ of the six longitudinal waveguides 151-156 measured from the bottom surface of the heating chamber 110 are different. That is, $h_1 \neq h_3 \neq h_5 \neq h_7 \neq h_9 \neq h_{11}$. Therefore, in the present embodiment, as long as the heating chamber 110 is large enough, the number of cavity modes in the heating chamber 110 is sufficiently plenty, and the cavity modes respectively excited by the six longitudinal waveguides 151-156 are different.

Similarly, the junctions between the heating chamber 110 and the six transverse waveguides 161-166 are located at different positions of the heating chamber 110, and thus heights $h_2$, $h_4$, $h_6$, $h_8$, $h_{10}$, and $h_{12}$ of the six transverse waveguides 161-166 measured from the bottom to the top of the heating chamber 110 are different. That is, $h_2 \neq h_4 \neq h_6 \neq h_8 \neq h_{10} \neq h_{12}$. As long as the number of cavity modes in the heating chamber 110 is plenty, the cavity modes respectively excited by the six transverser waveguides 161-166 can be different. Hence, multi-modes can be excited according to the present embodiment, so as to achieve uniform heating. In the present embodiment, microwave devices like impedance matchers and isolators (not shown) are not required but may be used in cases of: (1) reflected microwave powers are significantly high (in this case, isolators may be used to prevent the reflected microwave power back into the transmitters); (2) the cavity modes excited by some of the waveguides 151-156 and 161-166 are the same (in this case, the impedance matchers may be used, in order to change the input impedance of the waveguides 151-156 and 161-166 a little bit such that different cavity modes may be excited).

Figures 1, 1A, 2:
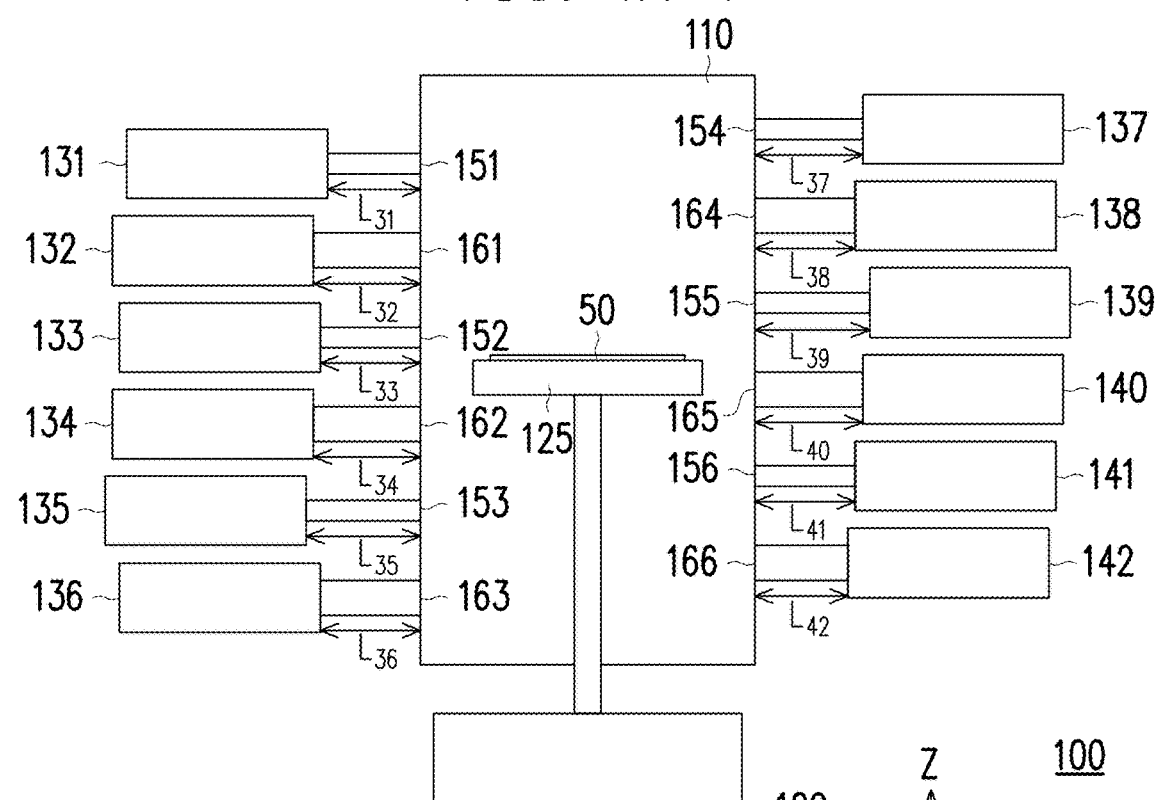

FIG. 1A-2 is another schematic view illustrating a multi-mode microwave heating device according to the first embodiment of the disclosure. With reference to FIG. 1A-2, the multi-mode microwave heating device 100 has six longitudinal waveguides 151-156 and six transverse waveguides 161-166 respectively installed in between the heating chamber 110 and microwave transmitters 131-142 for transmitting microwaves into the heating chamber 110 and exciting cavity modes of the heating chamber 110. The multi-mode microwave heating device 100 has the holder 125 arranged in the heating chamber 110 to hold the to-be-heated object 50. In the present embodiment, the holder 125 moves up and down and rotates through the rotating and elevating mechanism 120. The guided mode of the longitudinal waveguides 151-156 is the rectangular $TE_{10}$ mode, and the direction of the electric field in the longitudinal waveguides 151-156 is perpendicular to the plane (the x-y plane) of the holder 125. The guided mode of the transverse waveguides 161-166 is the rectangular $TE_{10}$ mode as well, but the direction of the electric field in the transverse waveguides 161-166 is parallel to the plane of the holder 125. The directions of the electric fields respectively in the longitudinal waveguides 151-156 and the transverse waveguides 161-166 are perpendicular; hence, the cavity modes excited by the six longitudinal waveguides 151-156 and the cavity modes excited by the transverse waveguides 161-166 are different and orthogonal. Besides, lengths $L_{31}$, $L_{33}$, $L_{35}$, $L_{37}$, $L_{39}$, and $L_{41}$ of the six longitudinal waveguides 151-156 are different. That is, $L_{31} \neq L_{33} \neq L_{35} \neq L_{37} \neq L_{39} \neq L_{41}$. Therefore, in the present embodiment, as long as the heating chamber 110 is large enough, the number of cavity modes in the heating chamber 110 is sufficiently plenty, and the cavity modes excited by the six longitudinal waveguides 151-156 are different.

Besides, lengths $L_{32}$, $L_{34}$, $L_{36}$, $L_{38}$, $L_{40}$, and $L_{42}$ of the six transverse waveguides 161-166 are different. That is, $L_3 \neq L_{34} \neq L_{36} \neq L_{38} \neq L_{40} \neq L_{42}$. As long as the number of cavity modes in the heating chamber 110 is sufficient, the cavity modes respectively excited by the six transverse waveguides 161-166 can be different. Hence, twelve modes can be excited according to the present embodiment, so as to achieve uniform heating. In the present embodiment, microwave devices such as impedance matchers and isolators (not shown) are not required but may be used in cases of: (1) reflected microwave powers are significantly high (in this case, isolators may be used to prevent the reflected microwave power from reflecting back into the transmitters); (2) the cavity modes excited by some of the waveguides 151-156 and 161-166 are the same (in this case, the impedance matchers may be used in order to change the input impedance of the waveguides 151-156 and 161-166 a little bit such that different cavity modes will be excited).

Figures 1, 1B:
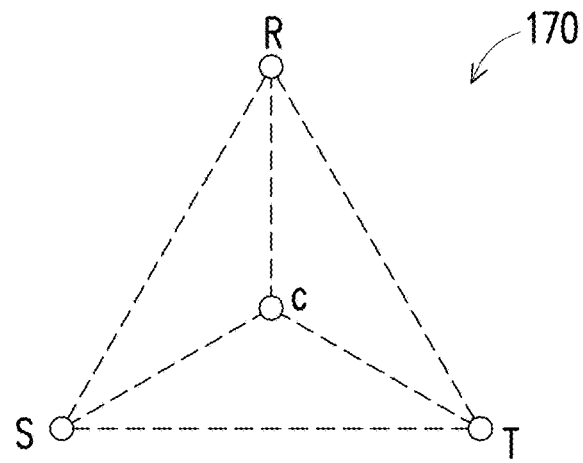
Figures 1, 1B, 2:
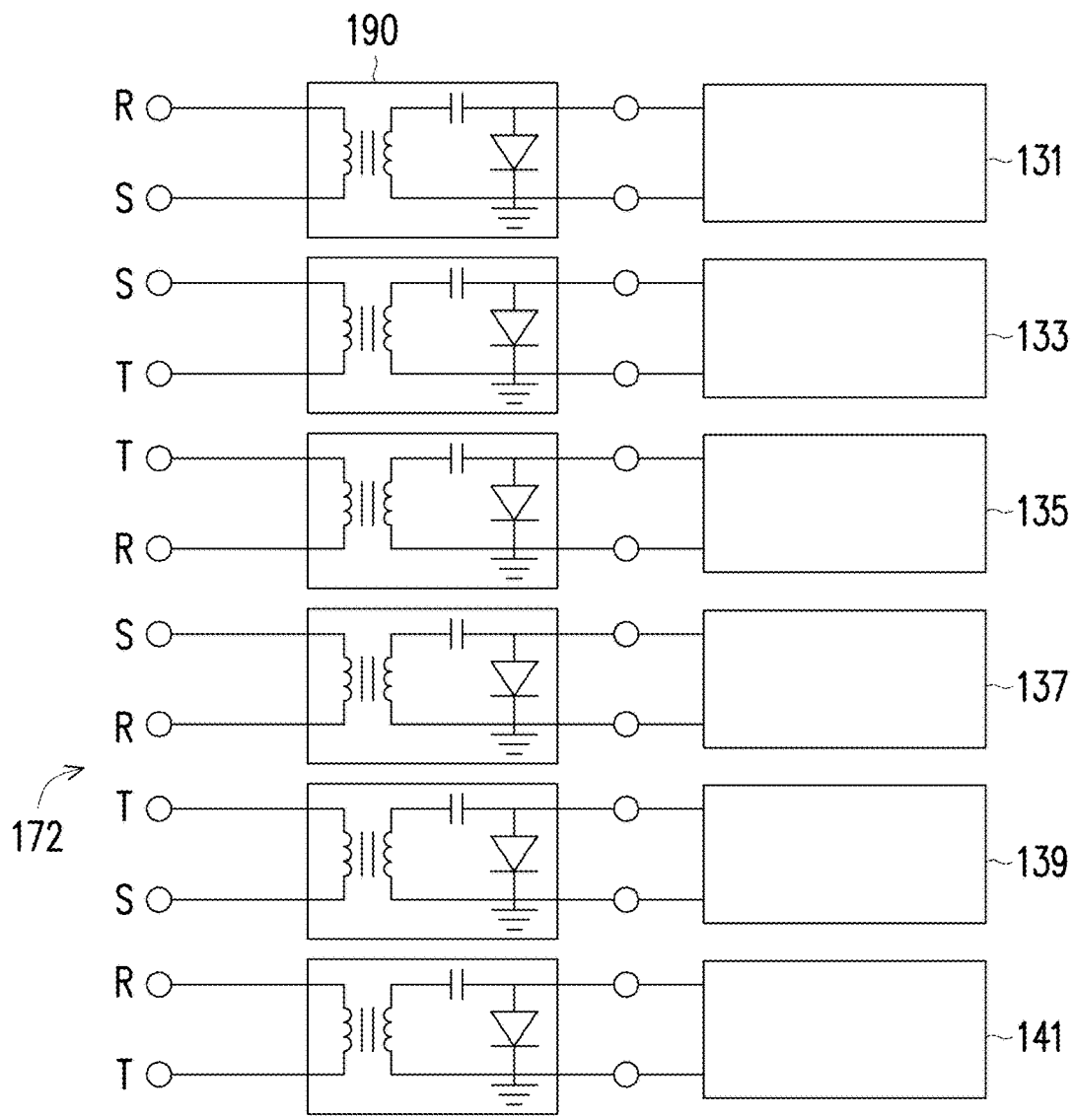
Figures 1, 1B, 2, 3:
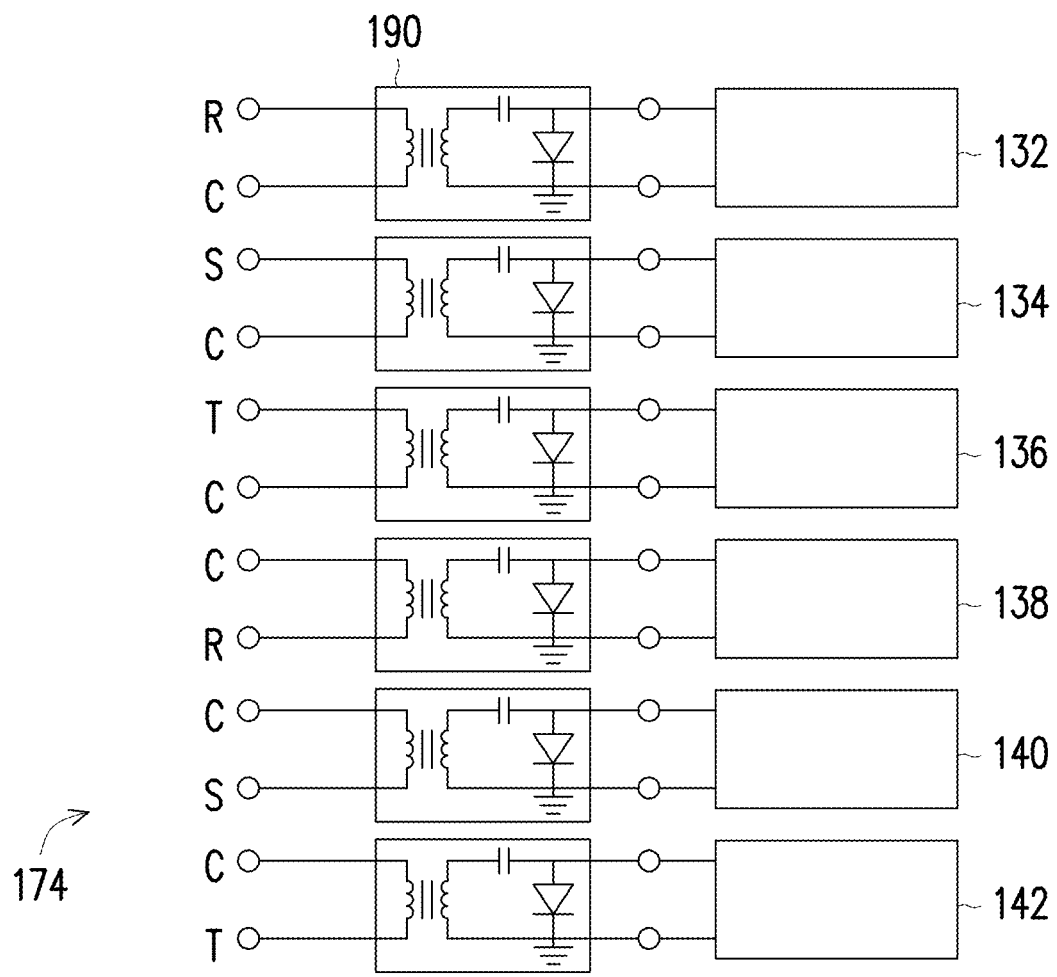

FIG. 1B-1, FIG. 1B-2, FIG. 1B-3, FIG. 1B-4, FIG. 1B-5 and FIG. 1B-6 are schematic views illustrating arrangement of a power circuit of the multi-mode microwave heating device according to the first embodiment of the disclosure. In one embodiment, the power circuit is arranged in the manner as shown in FIG. 1B-1, FIG. 1B-2, and FIG. 1B-3 to allow the microwave transmitters 131-142 depicted in FIG. 1A-1 and FIG. 1A-2 to transmit pulsed microwave in a one-by-one time sequence control method (also known as serial mode control method) such that any two of magnetrons are decoupled. Besides, the power circuit provided herein can be implemented using an industrial three-phase 60 (or 50) Hz alternating current (AC) power source 170 connecting in A (delta) type shown in FIG. 1B-1. The A (delta) type AC power source 170 supplies time-domain different-phased powers to half-wave-rectified microwave power supplies 190 as shown in FIG. 1B-2. Likewise, the inverse-Y(wye)-connected AC power sources 174 do the same thing as shown in FIG. 1B-3. The half-wave-rectified power supplies 190 respectively offer pulsed powers to the microwave transmitters 131-142. Specifically, three connecting leads named R, S, and T of industrial three-phase AC power source 170 offers three-phased powers named R-S, S-T, and T-R, of which phases differ from one another by 120 degrees in time domain. Using half-wave rectification, six-phased powers named R-S, S-T, T-R, S-R, T-S, and R-T are generated, of which phases differ from one another by 60 degrees in time domain, such that the six-phased delta-connected power source 172 is thus composed.

As shown in FIG. 1B-1, a common point C on the three-phase AC power source 170 may be selected to generate three-phased powers named R-C, S-C, and T-C, and their time-domain phases differ from one another by 120 degrees. Through half-wave rectification, six-phased power named R-C, S-C, T-C, C-R, C-S, and C-T can be generated, and their time-domain phases differ from one another by 60 degrees, so as to constitute the inverse-wye-connected power source 174. Accordingly, using parallel connection of the delta-connected power source 172 as well as the inverse-wye-connected power source 174 and half-wave rectification, twelve-phased powers named R-S, R-C, S-T, S-C, T-C, T-R, C-R, S-R, C-S, T-S, R-T, and C-T phased powers are generated, of which phases differ from one another by 30 degrees in time domain. The twelve-phased powers named R-S, R-C, S-T, S-C, T-C, T-R, C-R, S-R, C-S, T-S, R-T, and C-T are shown in FIG. 1B-2 and FIG. 1B-3 and twelve half-wave-rectified microwave power supplies 190 provide the twelve-phased powers. As shown in FIG. 1B-4, each of the half-wave-rectified power supplies 190 has a capacitance 191 respectively. In one embodiment, the capacitance 191 is composed of a variable capacitance. By adjusting the value of the capacitance 191 of at least one of the half-wave-rectified power supply 190, the microwave power pulse bandwidth of the microwave transmitters 131-142 are extended to produce a plurality of overlapped couplings, thereby multiplying microwave mode numbers. FIG. 1B-5 is schematic diagram illustrating an operating method combining serial mode control and coupling mode control according to an embodiment of the disclosure.

In particular, after adjusting the value of the capacitance 191, the twelve half-wave-rectified power supplies 190 supply powers to the twelve microwave transmitters 131-142 respectively, such that microwave transmitters 131-142 transmit pulsed microwave in a one-by-one time sequence control method (also known as serial mode control method). Therefore, 24 more mode numbers are produced by the twelve waveguides, as shown in FIG. 1B-4, such that the microwave mode numbers become 36 totally after multiplying, finally 72 mode numbers are produced by the twelve microwave transmitters. By increasing the mode numbers significantly, coupling mode control can multiply microwave heating uniformity and efficiency than serial mode control.

Besides, the twelve microwave transmitters 131-142 are powered such that the microwave powers are transmitted by the one-by-one time sequence control method (serial mode control method), while only a single microwave transmitter transmits the microwave power at one time. Therefore, no interference would occur between the microwave transmitters 131-142, and no mode lock would happen between magnetrons. In this way, the efficiency of the microwave transmitters 131-142 would not decrease. Meanwhile, as long as all of the waveguides 151-156 and 161-166, which corresponds to each of the microwave transmitters 131-142 respectively, excite the cavity modes in the heating chamber 110, the reflected power back into the microwave transmitters 131-142 is low even without isolators being installed. Thus, the efficiency of the microwave transmitters 131-142 would not decrease. In addition, since no isolators has to be installed in this embodiment, the power loss may be excluded, thereby improving the heating efficiency of the multi-mode microwave heating device 100.

In another embodiment, as shown in FIG. 1B-6, adjust the value of the capacitance 191 of the half-wave-rectified power supply 190 such that the microwave power pulse bandwidth of the microwave transmitters 131-142 are extended to produce much more overlapped couplings, thereby the microwave mode numbers become 60 due to 48 plus 12. Finally, 120 mode numbers are produced by the twenty four microwave transmitters.

Figure 2A:
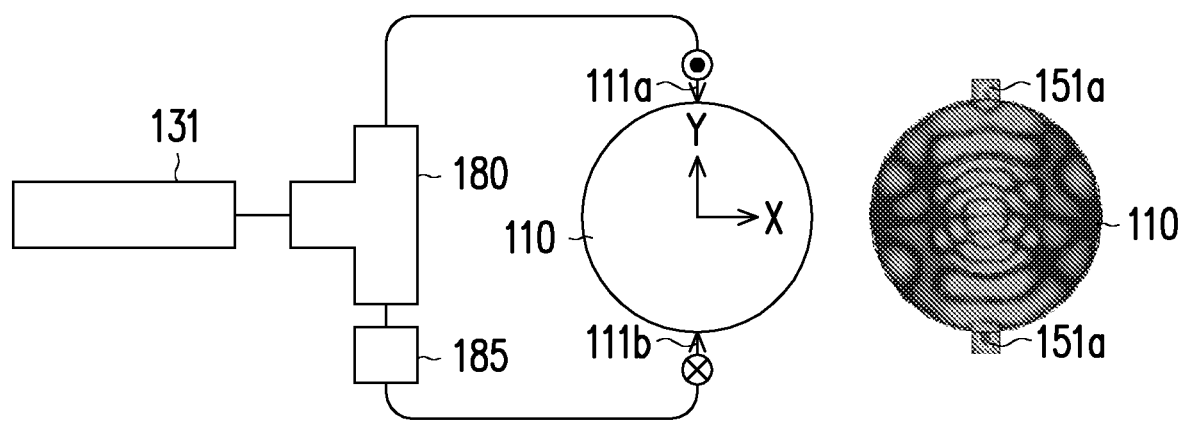
FIG. 2A is a schematic view illustrating the way to excite a longitudinal-odd mode according to the first embodiment of the disclosure.

FIG. 2A is a schematic view illustrating the way to excite a longitudinal-odd mode according to the first embodiment of the disclosure. Microwave power is transmitted by the first microwave transmitter 131, further divided by an in-phase equal-power divider and then fed into the heating chamber 110 through two equal-length longitudinal waveguides 151*a*. The junctions between the waveguides 151*a* and the heating chamber 110 are defined as the microwave input ports and denoted by thin arrows named 111*a* and 111*b*, as shown in FIG. 2A. A 180-degree phase shifter 185 is installed in between the input port 111*b* and the in-phase equal-power divider 180. Hence, the phase of the longitudinal electric field arriving at the input port 111*a* differs from the phase of the longitudinal electric field arriving at the input port 111*b* by 180 degrees (the polarization directions of the longitudinal electric fields are respectively denoted by ⊙ and ⊕, so as to represent that the polarization directions of the longitudinal electric fields are perpendicular to the x-y plane, and the phases of the longitudinal electric fields differ from each other by 180 degrees). Destructive interference thus occurs on a central line (the x axis) of the heating chamber 110, which is referred to as a longitudinal-odd mode. After simulation, the intensity distribution of electric field is identified as a longitudinal-even mode as shown by the image on the right-hand side of FIG. 2B. In the present embodiment, the impedance matcher (not shown) is not required unless the reflected power back into the microwave transmitter 131 is significantly high; in this case, the impedance matcher may be installed between the microwave transmitter 131 and the in-phase equal-power divider 180, so as to reduce the reflected power.

Figure 2B:
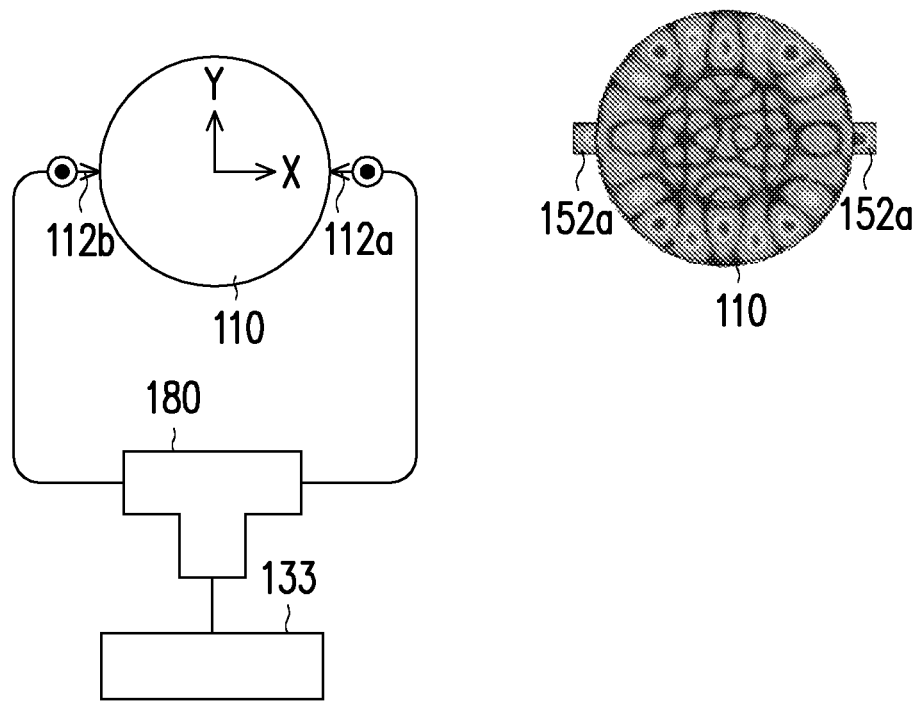
FIG. 2B is a schematic view illustrating the way to excite a longitudinal-even mode according to the first embodiment of the disclosure.

FIG. 2B is a schematic view illustrating the way to excite a longitudinal-even mode according to the first embodiment of the disclosure. Here, microwave power is transmitted by the first microwave transmitter 133, then divided by an in-phase equal-power divider and then fed into the heating chamber 110 through two equal-length longitudinal waveguides 152*a*. The junctions between the longitudinal waveguides 152*a* and the heating chamber 110 are defined as the microwave input ports and denoted by thin arrows named 112*a* and 112*b*, as shown in FIG. 2A. As long as the two longitudinal waveguides 152*a* have the same length, the phase of the longitudinal electric field arriving at the input port 112*a* is the same as the phase of the longitudinal electric field arriving at the input port 112*b* (the polarization directions of the longitudinal electric field are both denoted by ⊙). Constructive interference thus occurs on a central line (the y axis) of the heating chamber 110, which is referred to as a longitudinal-even mode. After simulation, the result of electric field intensity distribution is identified as a longitudinal-even mode for sure as shown on the right-hand side of FIG. 2B. In the present embodiment, the impedance matcher (not shown) is not required but may be used when the reflected power significantly high; in this case, the impedance matcher may be installed between the microwave transmitter 133 and the in-phase equal-power divider 180, so as to reduce the reflected power.

Figure 2C:
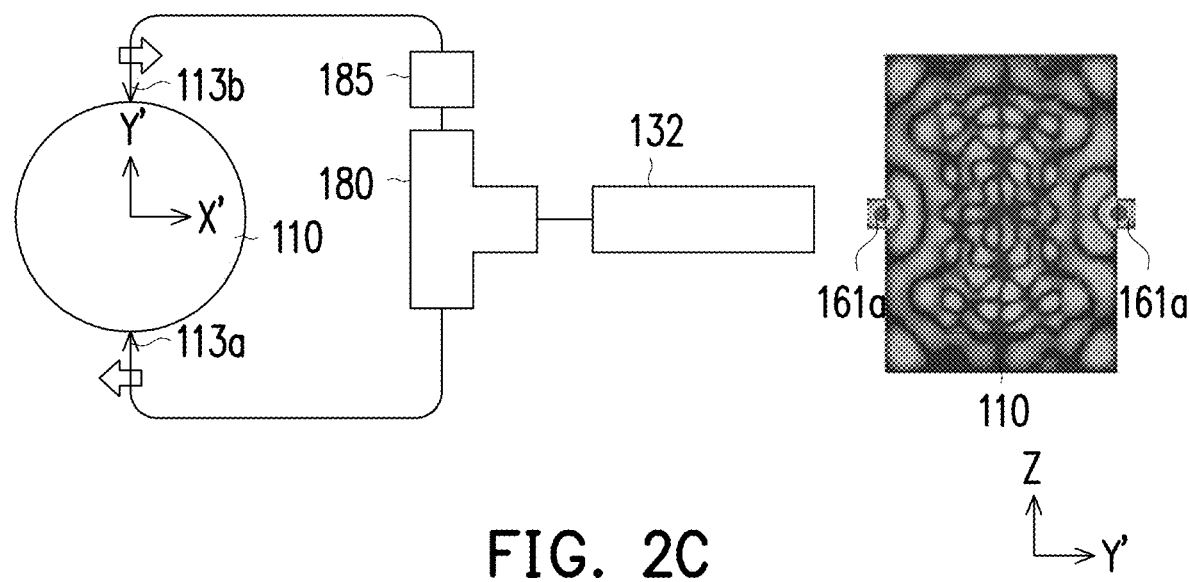
FIG. 2C is a schematic view illustrating the way to excite a transverse-odd mode according to the first embodiment of the disclosure.

FIG. 2C is a schematic view illustrating the way to excite a transverse-odd mode according to the first embodiment of the disclosure. Here, microwave power is transmitted by the second microwave transmitter 132, further divided by an in-phase equal-power divider 180 and then fed into the heating chamber 110 through two equal-length transverse waveguides 161*a*. The junctions between the transverse waveguides 161*a* and the heating chamber 110 are defined as the microwave input ports and are denoted by thin arrows and named 113*a* and 113*b*. The 180-degree phase shifter 185 may be assembled in between the input port 113*b* and the in-phase equal-power divider 180, whereas no 180-degree phase shifter 185 is installed in between the input port 113*a* and the in-phase equal-power divider 180. Hence, the phase of the transverse electric field arriving at the input port 113*a* differs from the phase of the transverse electric field arriving at the input port 113*b* by 180 degrees (the polarization directions of the transverse electric fields are respectively marked by thick arrows in FIG. 2C, the opposite directions of the arrows indicate the 180-degree difference in phase, and the two opposite directions are both parallel to the x'-y' plane). Destructive interference thus occurs on a central line (the z axis) of the heating chamber 110, which is referred to as a transverse-odd mode. After simulation, the intensity distribution of the transverse electric field in the transverse-odd mode is shown on the right-hand side of FIG. 2C. In the present embodiment, the impedance matcher (not shown) is not required unless the reflected power back into the microwave transmitter 132 is significant; in this case, the impedance matcher may be installed in between the microwave transmitter 132 and the in-phase equal-power divider 180, so as to reduce the reflected power.

Figure 2D:
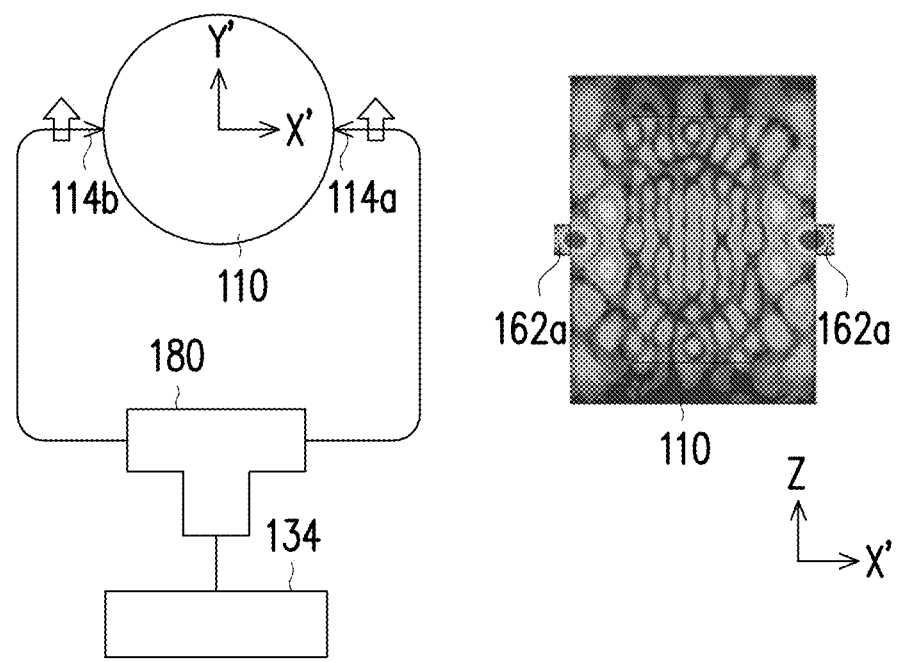
FIG. 2D is a schematic view illustrating the way to excite a transverse-even mode according to the first embodiment of the disclosure.

FIG. 2D is a schematic view illustrating the way to excite a transverse-even mode according to the first embodiment of the disclosure. The fourth microwave transmitter 134 may transmit the microwave into the heating chamber 110 through the in-phase equal-power divider 180 and two transverse waveguides 162a. The junctions between the waveguides 162a and the heating chamber 110 are defined as the microwave input ports and are denoted by thin arrows and named 114a and 114b. As long as the two transverse waveguides 162a have the same length, the phase of the transverse electric field arriving at the input port 114a is the same as the phase of the transverse electric field arriving at the input port 114b (the polarization directions of the transverse electric fields are both marked by thick arrows in FIG. 2D). Constructive interference thus occurs on a central line (the z axis) of the heating chamber 110, which is referred to as a transverse-even mode. After simulation, result of the intensity distribution of the transverse electric field is identified as a transverse-even mode for sure as shown on the right-hand side of FIG. 2D. In the present embodiment, the impedance matcher (not shown) is not required unless when the reflected power back into by the microwave transmitter 134 is significant; in this case, the impedance matcher may be assembled in between the microwave transmitter 134 and the in-phase equal-power divider 180, so as to reduce the reflected power.

Figure 2E:
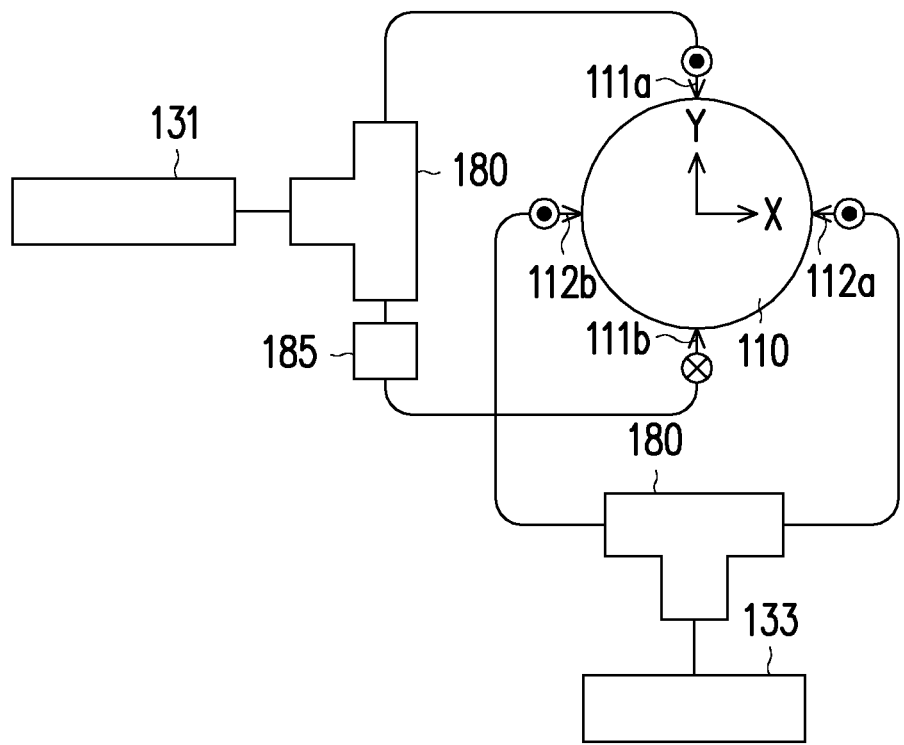
FIG. 2E is a schematic view illustrating the way to collectively excite the longitudinal-odd mode and the longitudinal-even mode according to the first embodiment of the disclosure.
Figure 2E:
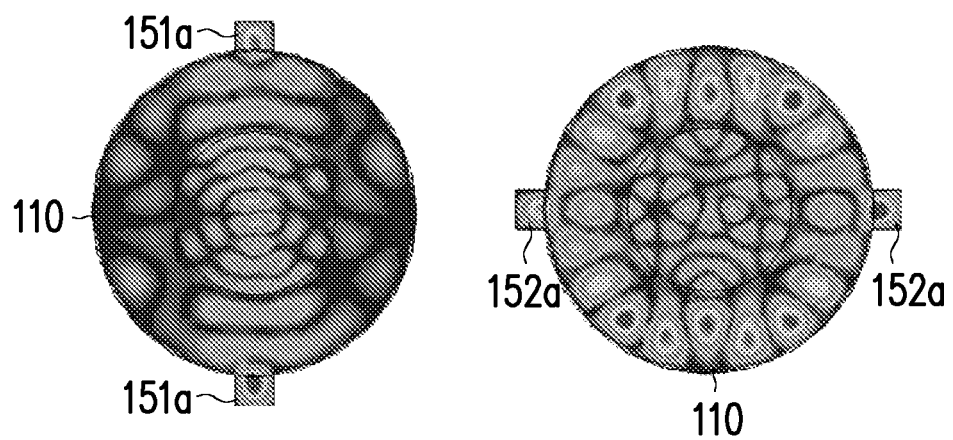

FIG. 2E is a schematic view illustrating the way to collectively excite the longitudinal-odd mode and the longitudinal-even mode according to the first embodiment of the disclosure. As shown in FIG. 2E, the longitudinal-odd mode shown in FIG. 2A and the longitudinal-even mode shown in FIG. 2B are combined in the present embodiment. For instance, the two input ports 111a and 111b in the longitudinal-odd mode are on the y axis in FIG. 2E; besides, the two input ports 112a and 112b in the longitudinal-even mode are on the x axis. The longitudinal-odd mode and the longitudinal-even mode are orthogonal modes, which are conserved by the symmetry in the x direction and the y direction.

Figure 2F:
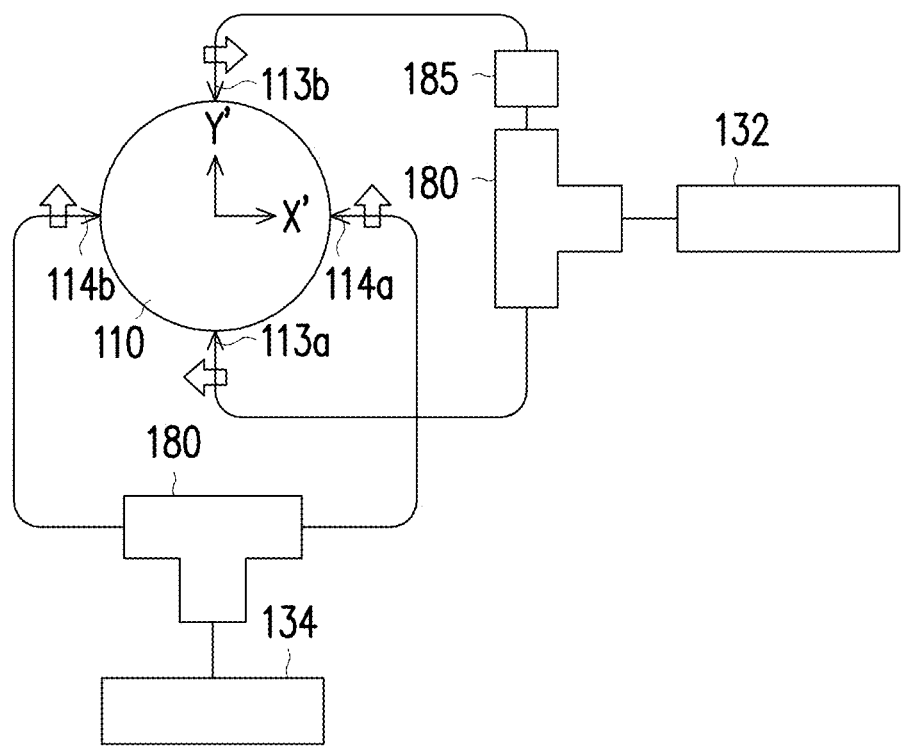
FIG. 2F is a schematic view illustrating the way to collectively excite the transverse-odd mode and the transverse-even mode according to the first embodiment of the disclosure.
Figure 2F:
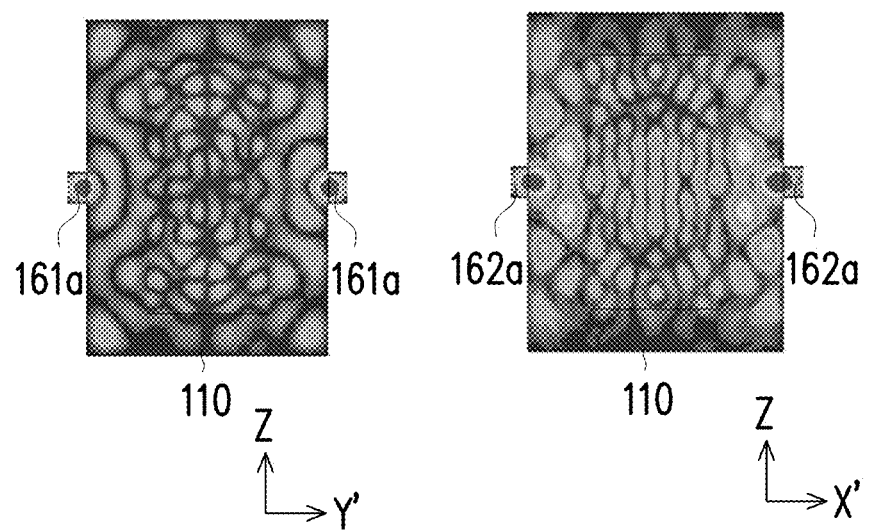

FIG. 2F is a schematic view illustrating the way to collectively excite the transverse-odd mode and the transverse-even mode according to the first embodiment of the disclosure. As shown in FIG. 2F, the transverse-odd mode shown in FIG. 2C and the transverse-even mode shown in FIG. 2D are combined in the present embodiment. For instance, the two input ports 113a and 113b in the transverse odd mode are on the y' axis in FIG. 2F; besides, the two input ports 114a and 114b in the transverse-even mode are on the x' axis. The transverse-odd mode and the transverse even mode are orthogonal and are conserved by the symmetry in the x' direction and the y' direction. Additionally, the longitudinal mode and the transverse mode are also orthogonal and are conserved by the symmetry in the x direction and the y direction. In the present embodiment, the coordinate x'y' is obtained by rotating the coordinate xy by 45 degrees around the z axis.

Figure 2G:
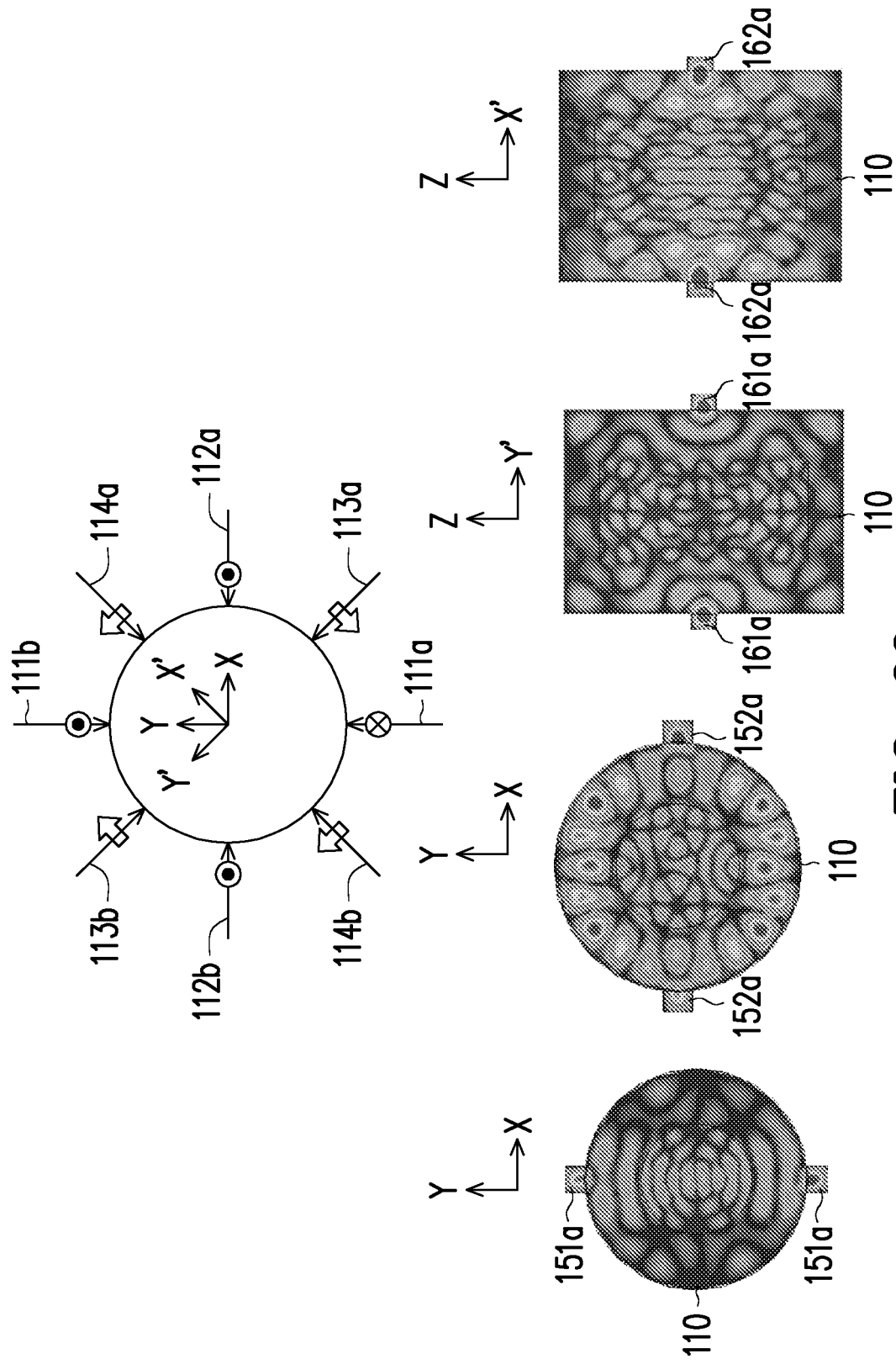
FIG. 2G is a schematic view illustrating the way to collectively excite the longitudinal-odd mode, the longitudinal-even mode, the transverse-odd mode, and the transverse-even mode according to the first embodiment of the disclosure.

FIG. 2G is a schematic view illustrating the way to collectively excite the longitudinal-odd mode, the longitudinal-even mode, the transverse-odd mode, and the transverse-even mode according to the first embodiment of the disclosure. In the present embodiment, the respective input ports in the longitudinal-odd mode, the longitudinal-even mode, the transverse-odd mode, and the transverse-even mode are 111a, 111b, 112a, 112b, 113a, 113b, 114a, and 114b. For illustrative purposes, FIG. 2G merely shows the eight input ports mentioned above and the polarization directions of the electric fields but does not show the four microwave transmitters corresponding to the eight input ports.

Figure 2H:
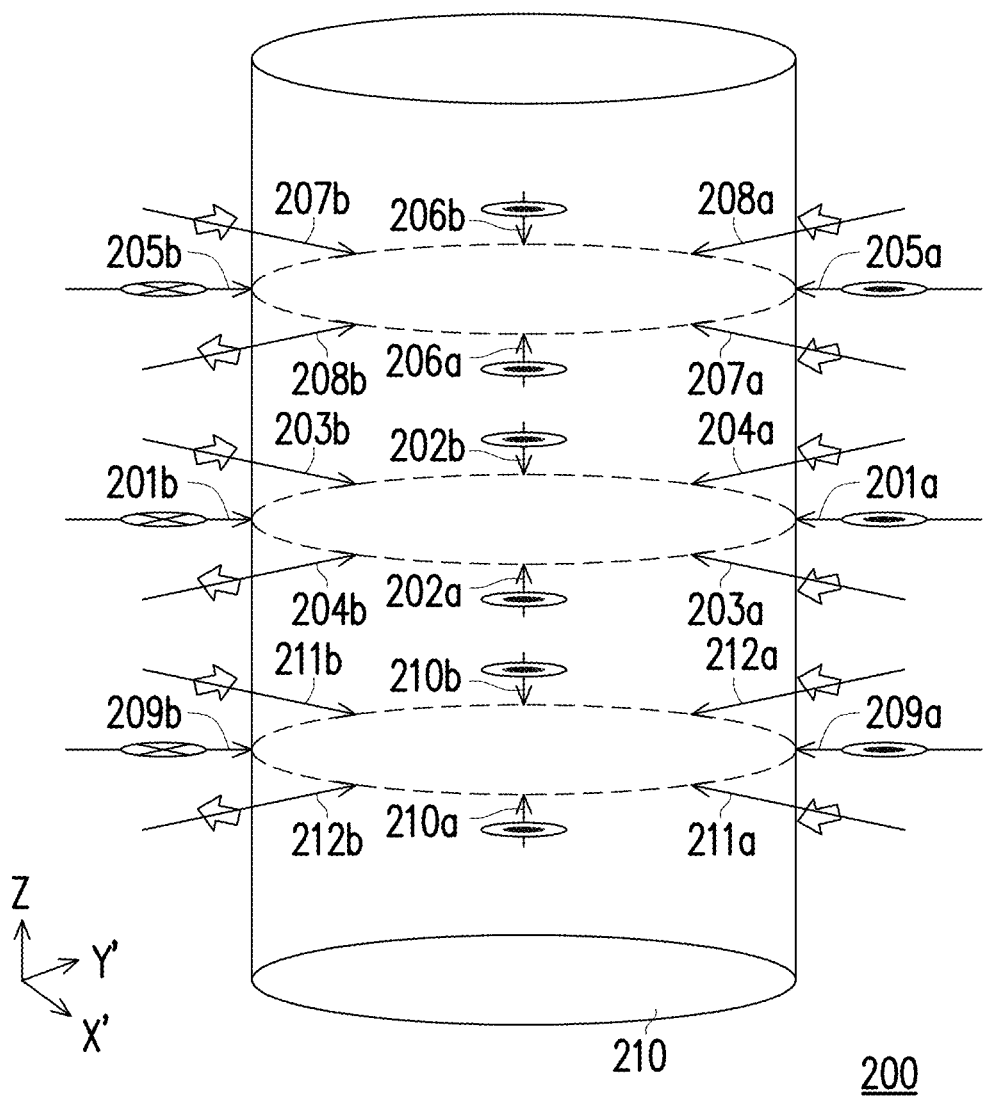
FIG. 2H is a three-dimensional perspective view illustrating a multi-mode microwave heating device according to a second embodiment of the disclosure.

FIG. 2H is a three-dimensional perspective view illustrating a multi-mode microwave heating device according to a second embodiment of the disclosure. In FIG. 2H, the thin arrow indicates the direction where the microwave is input, and the thick arrow indicates the polarization direction of the electric field. The ways to excite three groups of the longitudinal-odd mode, the longitudinal-even mode, the transverse-odd mode, and the transverse-even mode are incorporated in the multi-mode microwave heating device 200. In the first group, the respective input ports in the longitudinal-odd mode, the longitudinal-even mode, the transverse-odd mode, and the transverse-even mode are 201a, 201b, 202a, 202b, 203a, 203b, 204a, and 204b. The aforesaid input ports 201a, 201b, 202a, 202b, 203a, 203b, 204a, and 204b input microwaves respectively through the middle section of the heating chamber 210. In the second group, the respective input ports in the longitudinal-odd mode, the longitudinal-even mode, the transverse-odd mode, and the transverse-even mode are 205a, 205b, 206a, 206b, 207a, 207b, 208a, and 208b. The aforesaid input ports 205a, 205b, 206a, 206b, 207a, 207b, 208a, and 208b respectively input microwaves respectively through the upper section of the heating chamber 210. In the third group, the respective input ports in the longitudinal-odd mode, the longitudinal-even mode, the transverse-odd mode, and the transverse-even mode are 209a, 209b, 210a, 210b, 211a, 211b, 212a, and 212b. The aforesaid input ports 209a, 209b, 210a, 210b, 211a, 211b, 212a, and 212b input microwaves respectively through the lower section of the heating chamber 210. For illustrative purposes, FIG. 2H merely shows the twenty-four input ports mentioned above and the polarization directions of the electric fields but does not show the twelve microwave transmitters corresponding to the twenty-four input ports.

The arrangement of the power circuit provided in the present embodiment is the same as that provided in the first embodiment and shown in FIG. 1B-1. Therefore, the twelve microwave transmitters provided herein transmit the microwaves one by one according to a time sequence control method. Within one period of time, only one of the microwave transmitters transmits microwaves. Therefore, no interference would occur between the microwave transmitters, and no mode lock would happen between magnetrons. As long as the microwave transmitters excite the cavity modes in the heating chamber 210, the reflected power back into the transmitters is low even without isolators being installed. Because of that, power loss absorbed by isolators is excluded, and the heating efficiency as well as heating uniformity of the multi-mode microwave heating device 200 can be improved.

Figure 3A:
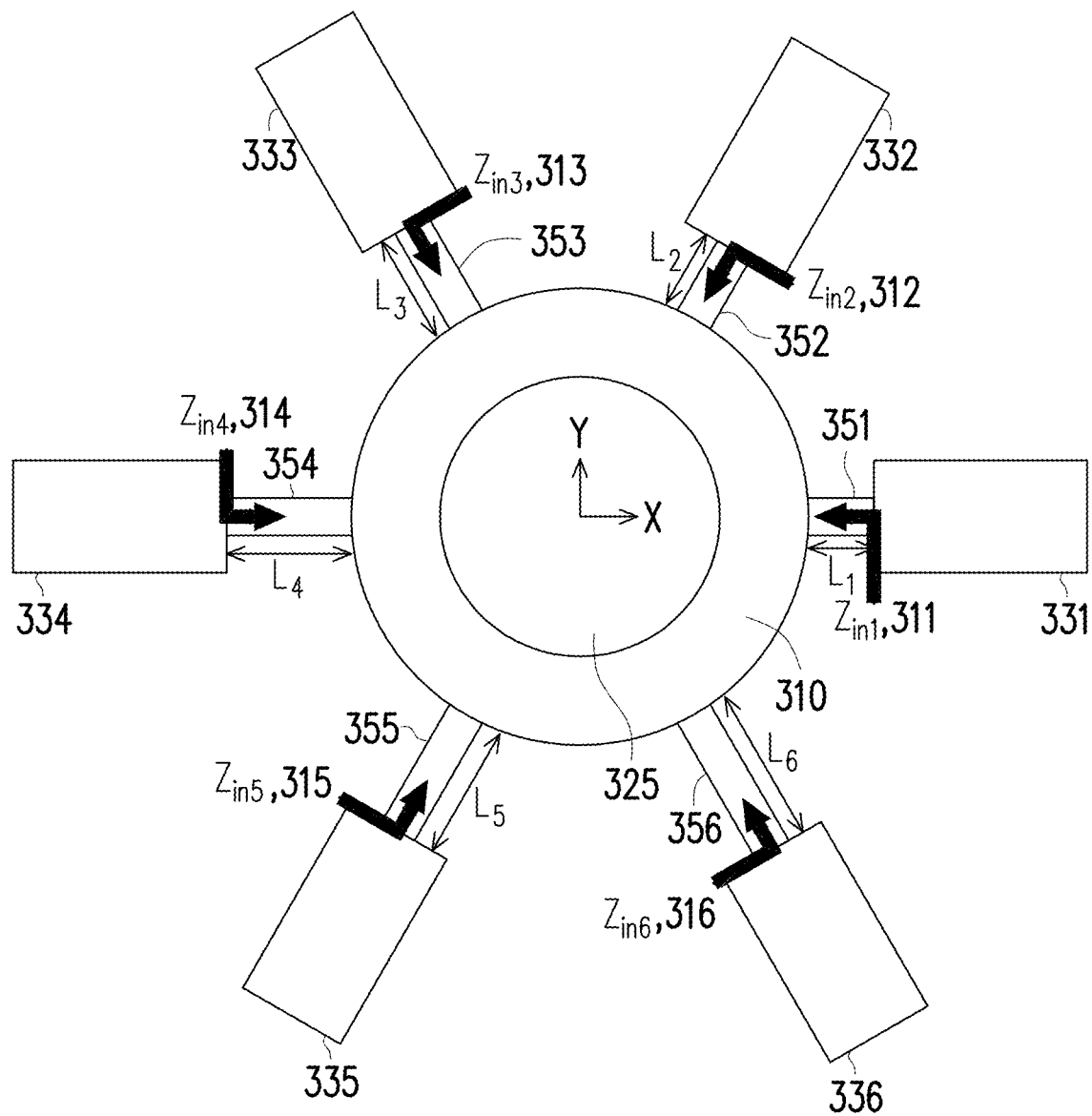
FIG. 3A is a schematic view illustrating a multi-mode microwave heating device according to a third embodiment of the disclosure.

FIG. 3A is a schematic view illustrating a multi-mode microwave heating device according to a third embodiment of the disclosure. Six microwave transmitters 331-336 are spaced from each other by 60 degrees for connecting to heating chamber 310 through six longitudinal waveguides 351-356, of which lengths $L_1$, $L_2$, $L_3$, $L_4$, $L_5$, and $L_6$ are different, and satisfy the constraint that $L_6-L_5=L_5-L_4=L_4$ $L_3=L_3$ $L_2=L_2-L_1=\lambda_g/12$. The length difference between the adjacent waveguides 351-356 is one twelfth of the guided wavelength $\lambda_g$, such that the input impedances $Z_{in1}$, $Z_{in3}$, $Z_{in3}$, $Z_{in4}$, $Z_{in5}$, and $Z_{in6}$ at the junctions (defined as the input ports) between each of the microwave transmitters 331-336 are different. That is, $Z_{in1} \neq Z_{in2} \neq Z_{in3} \neq Z_{in4} \neq Z_{in5} \neq Z_{in6}$, and the frequency pulling effects achieved by each of the microwave transmitters 331-336 are not the same. In the present embodiment, as long as the size of the heating chamber 310 is large enough, the number of the cavity modes is plenty; as such, the microwave transmitters 331-336 with differently slight-pulled frequencies are capable of exciting different cavity modes to achieve uniform heating.

Figure 3B:
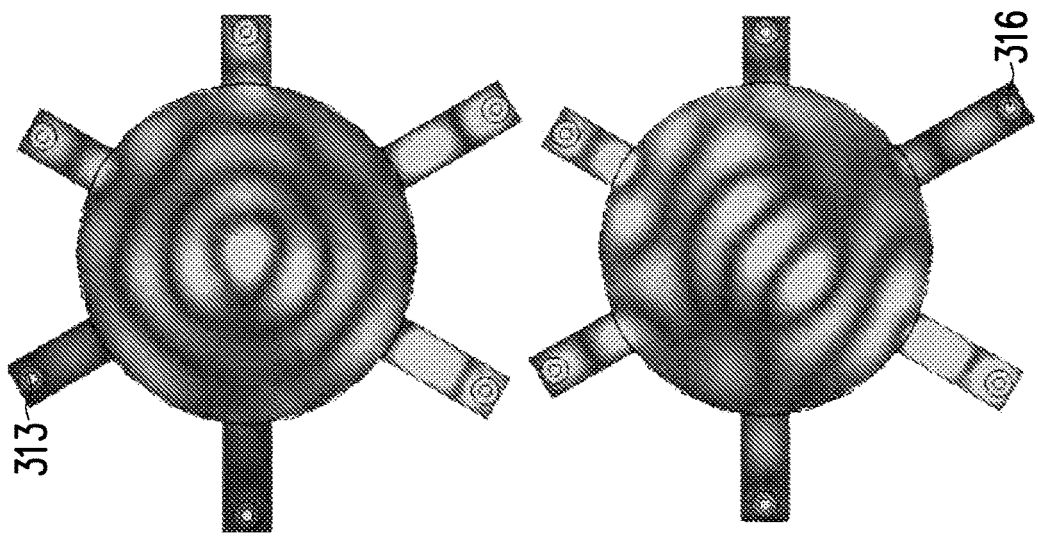
FIG. 3B is a schematic view illustrating a simulation result of intensity distribution of a longitudinal electric field in FIG. 3A.
Figure 3B:
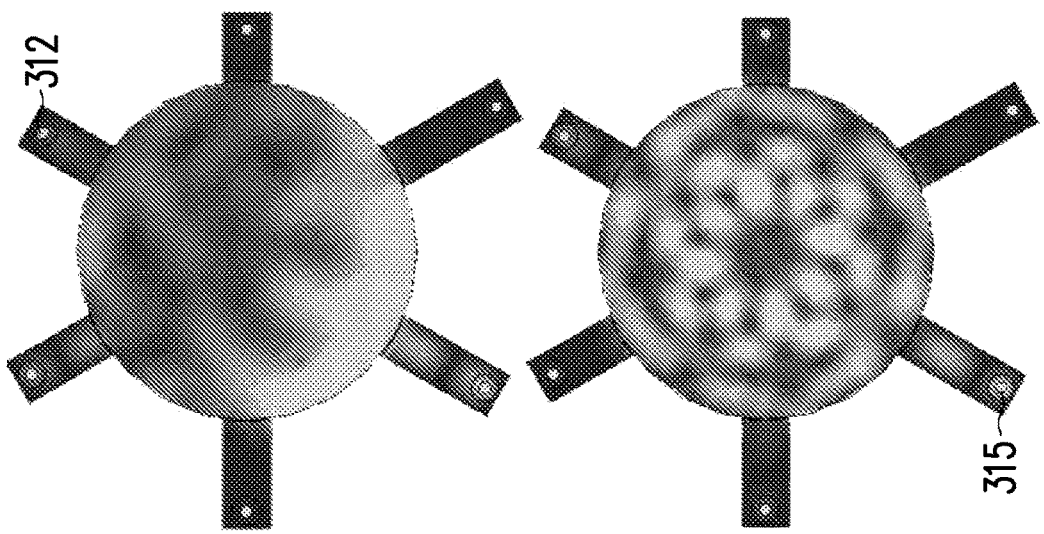
Figure 3B:
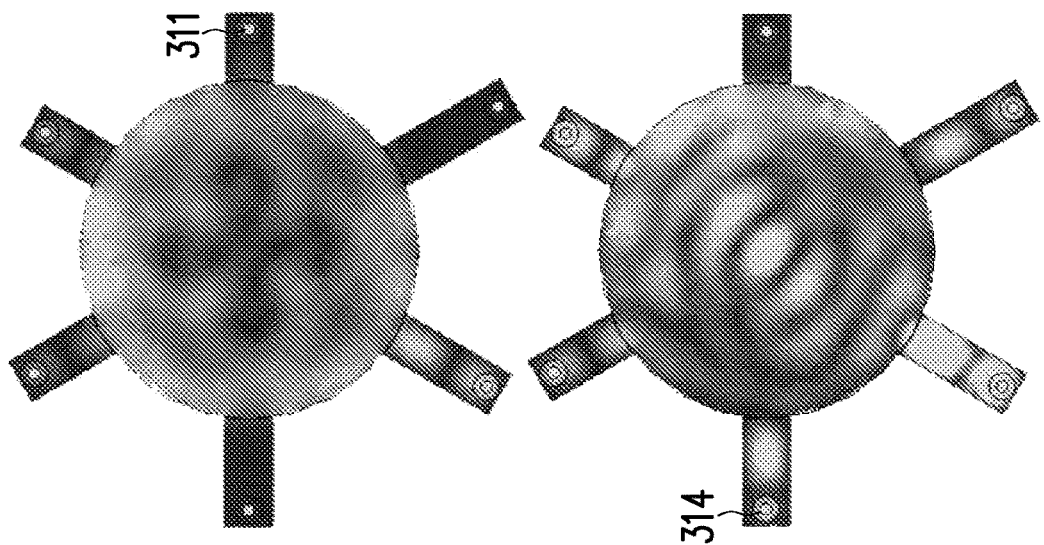

FIG. 3B is a schematic view illustrating a simulation result of intensity distribution of a longitudinal electric field depicted in FIG. 3A. When one of the six microwave transmitters 331-336 transmits the microwave, the other five microwave transmitters is not in operation; hence, microwave is transmitted from one transmitter at a time, and the other five transmitters are temporarily idle, as shown in FIG. 3B. According to the simulation as shown in FIG. 3B, the microwave transmitters 331-336 with differently slight-pulled frequencies are capable of exciting different cavity modes to achieve uniform heating.

In the present embodiment, the arrangement of powers can be similar to that provided in the first embodiment and shown in FIG. 1B-1, i.e., the industrial three-phase AC power source 170 supplies power to six half-wave-rectified power supplies 190 through the delta-connected power source 172 or the inverse-wye-connected power source 174, and the six half-wave-rectified power supplies 190 then offer powers to six microwave transmitters 331-336.

Figure 3C:
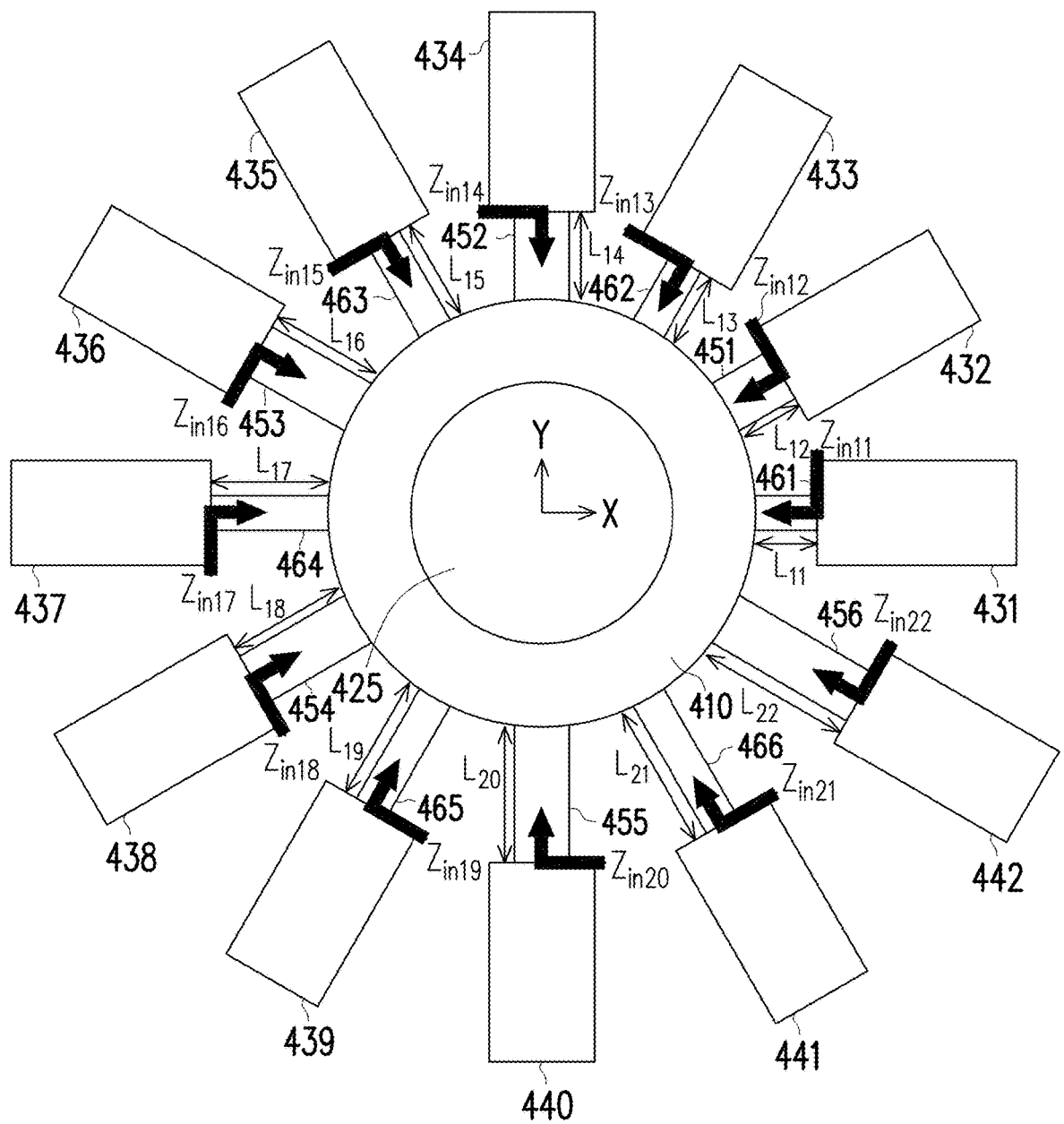
FIG. 3C schematically illustrates another implementation according to the third embodiment of the disclosure.
Figure 4:
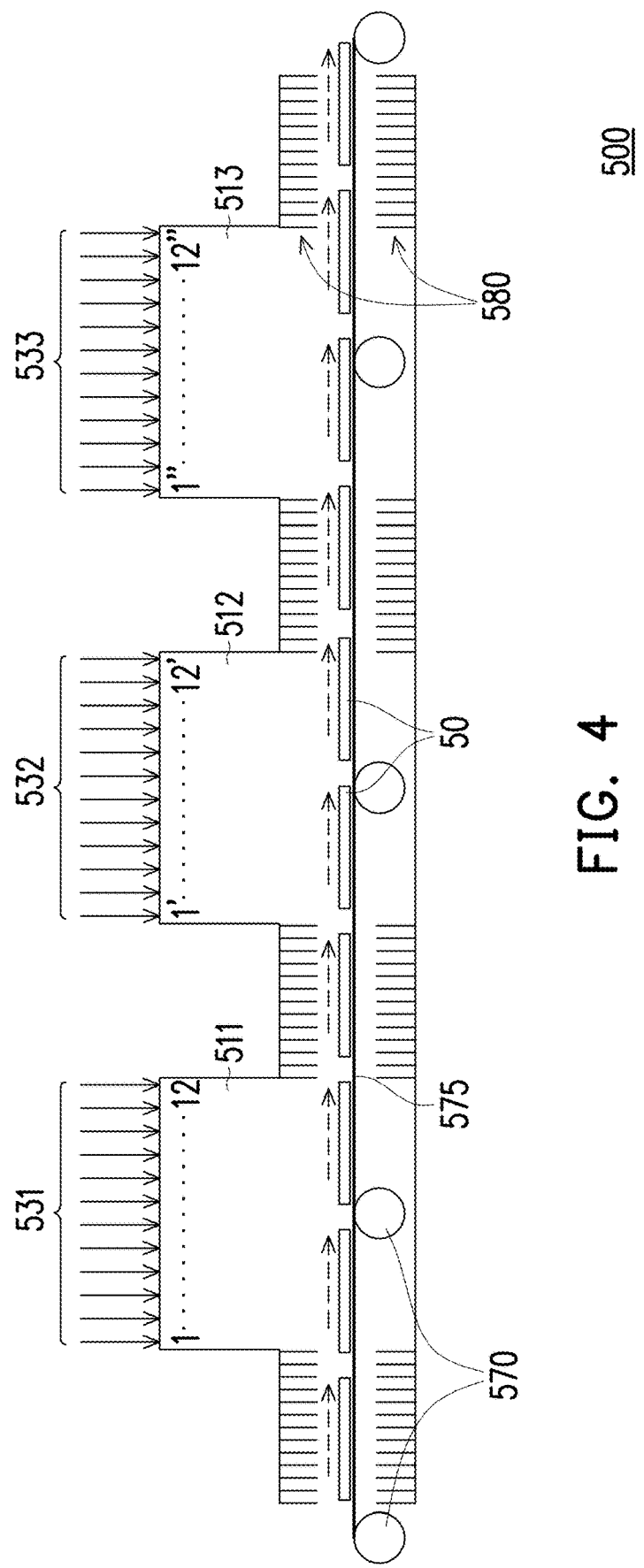

FIG. 3C schematically illustrates another implementation according to the third embodiment of the disclosure. In the present embodiment, microwave transmissions of the twelve microwave transmitters 431-442 are phase-delayed from each other by 30 degrees in time domain. Lengths $L_{12}$, $L_{14}$, $L_{16}$, $L_{18}$, $L_{20}$, and $L_{22}$ of the six longitudinal waveguides 451-456 are different and satisfy the following condition that $L_{22}-L_{20}=L_{20}-L_{18}=L_{18}-L_{16}=L_{16}-L_{14}=L_{14}-L_{12}=\lambda_g/12$. The length difference between the adjacent waveguides 451-456 is set to be one twelfth of the guided wavelength $\lambda_g$, such that the input impedances $Z_{in12}$, $Z_{in14}$, $Z_{in16}$, $Z_{in18}$, $Z_{in20}$, and $Z_{in22}$ at the junctions (defined as the input ports) are different, i.e., $Z_{in12} \neq Z_{in14} \neq Z_{in16} \neq Z_{in18} \neq Z_{in20} \neq Z_{in22}$. Thereby, the frequency pulling effects of the microwave transmitters 432, 434, 436, 438, 440, and 442 are different.

Similarly, lengths $L_{11}$, $L_{13}$, $L_{15}$, $L_{17}$, $L_{19}$, and $L_{21}$ of the six transverse waveguides 461-466 are different and satisfy the following condition that $L_{21}-L_{19}=L_{19}-L_{17}=L_{17}-L_{15}=L_{15}-L_{13}=L_{13}-L_{11}=\lambda_g/12$. That is, the length difference between the adjacent waveguides 461-466 is one twelfth of the wavelength $\lambda_g$, such that the input impedances $Z_{in11}$, $Z_{in13}$, $Z_{in15}$, $Z_{in17}$, $Z_{in19}$, and $Z_{in21}$ at the junctions (defined as the input ports) are different, i.e., $Z_{in11} \neq Z_{in13} \neq Z_{in15} \neq Z_{in17} \neq Z_{in19} \neq Z_{in21}$. Thereby, the frequency pulling effects of the microwave transmitters 431, 433, 435, 437, 439, and 441 are different. In the present embodiment, as long as the size of the heating chamber 410 is large enough, the number of the cavity modes is plenty; as such, the microwave transmitters 431-442 with differently slight-pulled frequencies are capable of exciting different cavity modes to achieve uniform heating.

In the present embodiment, the arrangement of powers can be the same as that provided in the first embodiment and shown in FIG. 1B-1, i.e., the industrial three-phase AC power source 170 offers powers to the twelve half-wave-rectified power supplies (not shown) using a delta-connected power source 172 combined with an inverse-wye-connected power source 174, by which the twelve microwave transmitters 431-442 are powered.

Figures 1, 1B, 2, 3, 4:
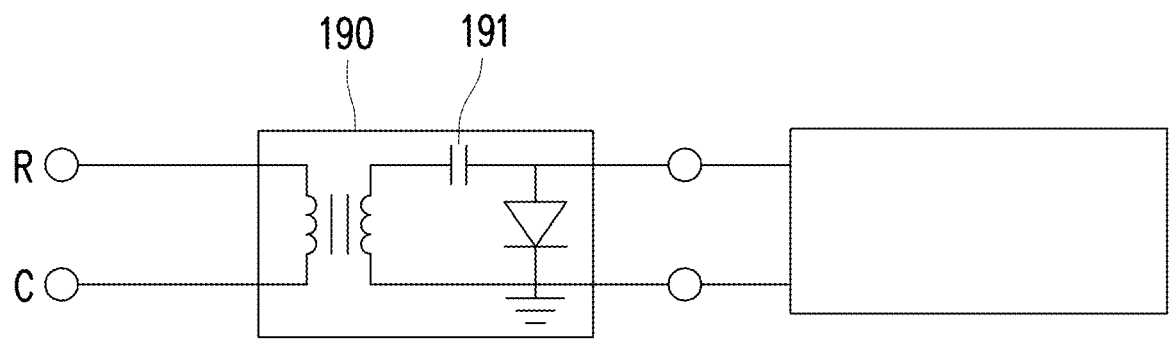

FIG. 4 is a schematic view illustrating a multi-mode microwave heating device according to a fourth embodiment of the disclosure. In the multi-mode microwave heating device 500 provided in the present embodiment, a transport belt 575 is continuously driven by rolls 570 in a roll-to-roll manner, so as to transport the to-be-heated object 50 in a direction shown by the arrow in FIG. 4. The multi-mode microwave heating device 500 can be equipped with multiple heating chambers (FIG. 4 exemplarily shows three heating chambers 511, 512, and 513) as well as multiple microwave transmitters (FIG. 4 exemplarily shows three groups of microwave transmitters 531, 532, and 533). The three groups of microwave transmitters respectively have multiple microwave transmitters 1-12, 1'-12', and 1"-12", and each group of microwave transmitters corresponds to multiple longitudinal waveguides and multiple transverse waveguides (not shown). In the present embodiment, the connection manner between each group of waveguides and the heating chambers 511, 512, and 513 may be referred to as those provided in the previous embodiments and may be implemented according to any of the previous embodiments. Besides, low-pass filters 580 may be arranged at inlets and outlets of the heating chambers 511, 512, and 513, as well as between the heating chambers 511, 512, and 513, such that microwave leakages from chambers and cross couples between chambers are excluded.

In the present embodiment, the arrangement of power can be similar to that provided in the first embodiment and shown in FIG. 1B-1, i.e., the industrial three-phase AC power source 170 supplies power to twelve half-wave-rectified power supplies in each group through the delta-connected power source 172 or the inverse-wye-connected power source 174, and the twelve half-wave-rectified power supplies then supply power to each group of twelve microwave transmitters 1-12, 1'-12', and 1"-12". The low-pass filters 580 serve to block interference of microwaves among the heating chambers 511, 512, and 513; hence, no interference (couple) would occur between each group of microwave transmitters, and no mode lock would happen; and the efficiency of each microwave transmitter and the diversity of the cavity modes can be guaranteed.

Figure 5:
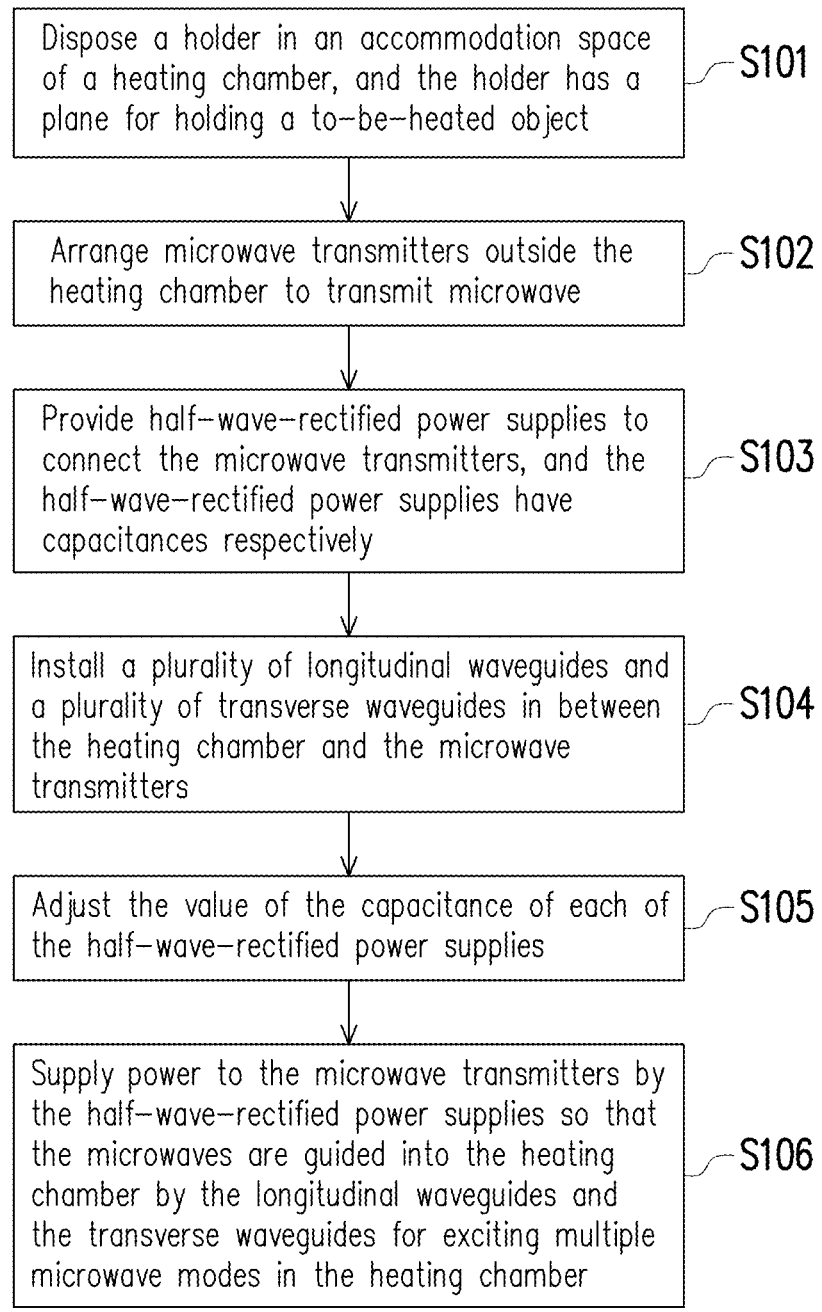

FIG. 5 is a schematic diagram of the sequence illustrating steps of an operating method microwave applying to a microwave heating device according to the fifth embodiment of the disclosure.

In step S101, dispose a holder in an accommodation space of a heating chamber, and the holder has a plane for holding a to-be-heated object.

In step S102, arrange a plurality of microwave transmitters outside the heating chamber to transmit microwave.

In step S103, provide a plurality of half-wave-rectified power supplies to connect the microwave transmitters, and the half-wave-rectified power supplies have capacitances respectively. The capacitance is composed of a variable capacitance. The quantity of the half-wave-rectified power supply and the operation method can be reference to above embodiments.

In step S104, install a plurality of longitudinal waveguides and a plurality of transverse waveguides in between the heating chamber and the microwave transmitters, and the directions of electric field polarization of the longitudinal waveguides are perpendicular to the plane of the holder, and the directions of electric field polarization of the transverse waveguides are parallel to the plane of the holder. The arrangement of longitudinal waveguides and transverse waveguides can be reference to above embodiments.

In step S105, adjust the value of the capacitance of each of the half-wave-rectified power supplies, such that the microwave power pulse bandwidth of the microwave transmitters are extended to produce a plurality of overlapped couplings, thereby multiply microwave mode numbers.

In step S106, supply power to the microwave transmitters by the half-wave-rectified power supplies so that the microwaves are guided into the heating chamber by the longitudinal waveguides and the transverse waveguides for exciting multiple microwave modes in the heating chamber, so as to apply microwave heating to the to-be-heated object.

Figure 6:
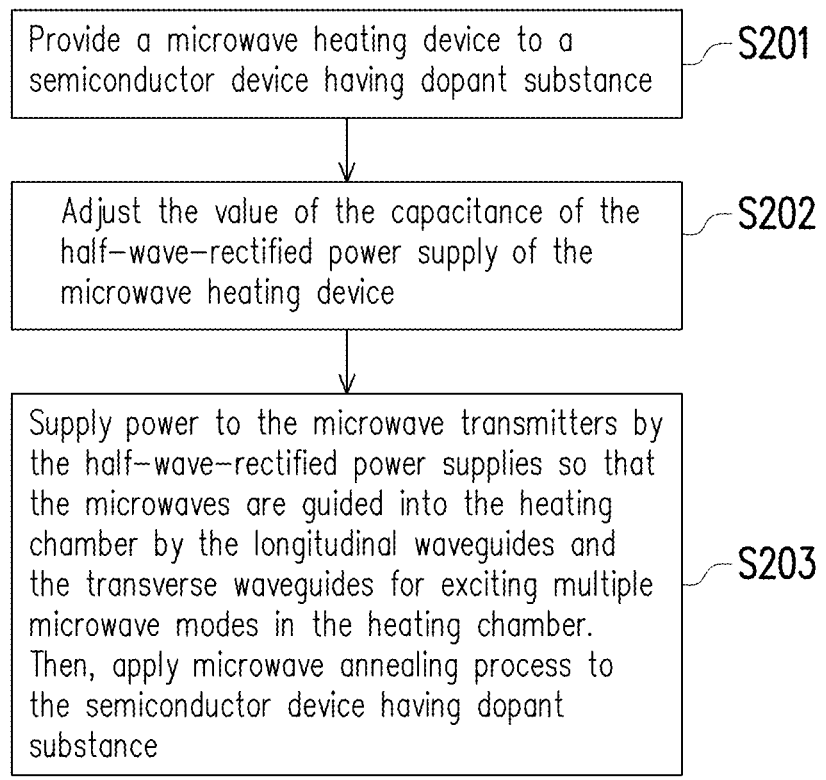

FIG. 6 is a schematic diagram of the sequence illustrating steps of a microwave annealing process microwave according to the sixth embodiment of the disclosure.

In step S201, provide a microwave heating device as described above to a semiconductor device having dopant substance.

In step S202, adjust the value of the capacitance of the half-wave-rectified power supply of the microwave heating device, such that the microwave power pulse bandwidth of the microwave transmitters connected respectively are extended to produce a plurality of overlapped couplings, thereby multiply microwave mode numbers.

In step S203, supply power to the microwave transmitters by the half-wave-rectified power supplies so that the microwaves are guided into the heating chamber by the longitudinal waveguides and the transverse waveguides for exciting multiple microwave modes in the heating chamber. Then, apply microwave annealing process to the semiconductor device having dopant substance.

An experiment is provided in the following for illustrating the effect of the present embodiment. However, it is noted that the disclosure may still be implemented in many other different forms and should not be construed as limited to the experiment described hereinafter.

Experiment I

Comparison of operation method 1 (microwave annealing processes without coupling-mode operation method) and operation method 2 (microwave annealing processes with applying coupling-mode operation method) is made. In the present experiment, operation method 1 and 2 of microwave annealing processes apply to 12" wafer having dopant As using microwave heating frequency 2.45 GHz. Refer to Table A, operation method 1 is sequence control method (serial mode control), and the microwave transmitters transmit pulsed microwave in a one-by-one time sequence. Operation method 2 combines serial mode control and coupling mode control, and the microwave power pulse bandwidth of the microwave transmitters are extended to produce a plurality of overlapped couplings, thereby multiply microwave mode numbers. As shown in Table A, by method 2, annealing time is reduced about 20%, sheet resistance is reduced about 2.5% and the heating ununiformity is reduced about 80% than by method 1.

TABLE A

| semiconductor device having dopant substance: 12" wafer having dopant As | operation method 1 (without coupling) | operation method 2 (with coupling) |
|---|---|---|
| annealing time (sec.) | 600 | 480 |
| Ω/□ (sheet resistance) | 147.3 | 143.6 |
| ununiformity (%) | 4.1 | 0.8 |

To sum up, in the present disclosure, the microwave transmitters are connected to the heating chamber through the longitudinal waveguides and transverse waveguides for guiding microwaves to the inside of the heating chamber and exciting multiple cavity modes in the heating chamber, so as to achieve uniform microwave heating. The three-phase AC power source supplies power to the half-wave-rectified power supplies, and the half-wave-rectified power supplies respectively power the microwave transmitters. Through adjusting (increasing) the value of the capacitance of the half-wave-rectified power supply such that the microwave power pulse bandwidth of the microwave transmitters are extended to produce a plurality of overlapped couplings, thereby multiply microwave mode numbers. The more the microwave mode number are, the better microwave heating uniformity is. The microwave heating efficiency and uniformity of the annealing process applying to semiconductor device having dopant substance are also improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An operating method of microwave heating device comprising:
   providing a heating chamber having an accommodation space in which a holder is disposed, and the holder has a plane;
   arranging a plurality of microwave transmitters outside the heating chamber to transmit microwave into the heating chamber;
   providing a plurality of half-wave-rectified power supplies to connect the microwave transmitters, and each of the half-wave-rectified power supplies has a capacitance respectively;
   installing a plurality of longitudinal waveguides and a plurality of transverse waveguides in between the heating chamber and the microwave transmitters, and the directions of electric field polarization of the longitudinal waveguides are perpendicular to the plane of the holder, and the directions of electric field polarization of the transverse waveguides are parallel to the plane of the holder;
   adjusting the value of the capacitance of at least one of the half-wave-rectified power supplies, such that the microwave power pulse bandwidth of the microwave transmitters are extended to produce a plurality of overlapped couplings; and
   supplying power to the microwave transmitters by the half-wave-rectified power supplies so that the microwaves are guided into the heating chamber by the longitudinal waveguides and the transverse waveguides for exciting multiple microwave modes in the heating chamber.

2. The operating method of microwave heating device of claim 1, wherein the longitudinal waveguides are divided into two sets with equal power, and the two divided sets are installed symmetrically connected to the heating chamber, such that the microwaves with out-of-phase electric fields are symmetrically guided into the heating chamber to excite multiple longitudinal-odd modes.

3. The operating method of microwave heating device of claim 1, wherein the longitudinal waveguides are divided into two sets with equal power, and the two sets are installed symmetrically connected to the heating chamber, such that the microwaves with in-phase electric fields are symmetrically guided into the heating chamber to excite multiple longitudinal-even modes.

4. The operating method of microwave heating device of claim 1, wherein the transverse waveguides are divided into two sets with equal power, and the two sets are installed symmetrically connected to the heating chamber, such that microwaves with out-of-phase electric fields are symmetrically guided into the heating chamber to excite multiple transverse-odd modes.

5. The operating method of microwave heating device of claim 1, wherein the transverse waveguides are divided into two sets with equal power, and the two sets are installed symmetrically connected to the heating chamber, such that microwaves with in-phase electric fields are symmetrically guided into the heating chamber to excite multiple transverse-even modes.

6. The operating method of microwave heating device of claim 1, wherein the longitudinal waveguides are spaced from each other by a fixed angle and installed in between the heating chamber and the corresponding microwave transmitters to excite the multiple longitudinal modes, a difference in length of the adjacent waveguides is set to be a one-half guided wavelength divided by the number of the corresponding longitudinal waveguides.

7. The operating method of microwave heating device of claim 1, wherein the transverse waveguides are spaced from each other by a fixed angle and installed in between the heating chamber and the corresponding microwave transmitters to excite the multiple transverse modes, a difference in length of the adjacent waveguides is set to be a one-half guided wavelength divided by the number of the corresponding transverse waveguides.

8. The operating method of microwave heating device of claim 1, wherein the half-wave-rectified power supplies are twelve, and before the step of adjusting the value of the capacitance, the half-wave-rectified power supplies are powered by an industrial three-phase alternate-current power source having three connecting leads named R, S, and T, and connecting the three connecting leads in a delta type to generate six-phased powers named R-S, S-T, T-R, S-R, T-S, and R-T providing to six of the half-wave-rectified power supplies.

9. The operating method of microwave heating device of claim 8, wherein before the step of adjusting the value of the capacitance, the half-wave-rectified power supplies are powered by an industrial three-phase alternate-current power source having three connecting leads named R, S, and T, and connecting the three connecting leads to a common-point C on the three-phase AC power source i in an inverse-wye type to generate six-phased powers named R-C, S-C, T-C, C-R, C-S, and C-T providing to another six of the half-wave-rectified power supplies.

10. The operating method of microwave heating device of claim 1, wherein the half-wave-rectified power supplies are twelve, and before the step of adjusting the value of the capacitance, the half-wave-rectified power supplies are powered by an industrial three-phase alternate-current power source connected in a delta type as well as in an inverse-wye type to generate twelve-phased powers named R-S, R-C, S-T, S-C, T-C, T-R, C-R, S-R, C-S, T-S, R-T, C-T providing to twelve of the half-wave-rectified power supplies.

11. The operating method of microwave heating device of claim 1, wherein the capacitance is composed of a variable capacitance.

12. A microwave annealing process applying to a semiconductor device having dopant substance comprising:
providing a microwave heating device including:
a heating chamber arranged having an accommodation space in which a holder is disposed, and the holder has a plane for holding the semiconductor device having dopant substance;
a plurality of microwave transmitters arranged outside the heating chamber to transmit microwaves into the heating chamber;
a plurality of half-wave-rectified power supplies arranged to connect the microwave transmitters, and each of the half-wave-rectified power supplies has a capacitance respectively; and
a plurality of longitudinal waveguides and a plurality of transverse waveguides installed in between the heating chamber and the microwave transmitters, wherein the directions of electric field polarization of the longitudinal waveguides are perpendicular to the plane of the holder, and the directions of electric field polarization of the transverse waveguides are parallel to the plane of the holder;
adjusting the value of the capacitance of at least one of the half-wave-rectified power supplies, such that the microwave power pulse bandwidth of the microwave transmitters are extended to produce a plurality of overlapped couplings, thereby multiplying microwave mode numbers; and
supplying power to the microwave transmitters by the half-wave-rectified power supplies so that the microwaves are guided into the heating chamber by the longitudinal waveguides and the transverse waveguides for exciting multiple microwave modes in the heating chamber; and
applying microwave annealing process to the semiconductor device having dopant substance.

13. The microwave annealing process of claim 12 wherein the longitudinal waveguides are divided into two sets with equal power, and the two divided sets are installed symmetrically connected to the heating chamber, such that the microwaves with out-of-phase electric fields are symmetrically guided into the heating chamber to excite multiple longitudinal-odd modes.

14. The microwave annealing process of claim 12, wherein the longitudinal waveguides are divided into two sets with equal power, and the two sets are installed symmetrically connected to the heating chamber, such that the microwaves with in-phase electric fields are symmetrically guided into the heating chamber to excite multiple longitudinal-even modes.

15. The microwave annealing process of claim 12, wherein the transverse waveguides are divided into two sets with equal power, and the two sets are installed symmetrically connected to the heating chamber, such that microwaves with out-of-phase electric fields are symmetrically guided into the heating chamber to excite multiple transverse-odd modes.

16. The microwave annealing process of claim 12, wherein the transverse waveguides are divided into two sets with equal power, and the two sets are installed symmetrically connected to the heating chamber, such that microwaves with in-phase electric fields are symmetrically guided into the heating chamber to excite multiple transverse-even modes.

17. The microwave annealing process of claim 12, wherein the longitudinal waveguides are spaced from each other by a fixed angle and installed in between the heating chamber and the corresponding microwave transmitters to excite the multiple longitudinal modes, a difference in length of the adjacent waveguides is set to be a one-half guided wavelength divided by the number of the corresponding longitudinal waveguides, and wherein the transverse waveguides are spaced from each other by a fixed angle and installed in between the heating chamber and the corresponding microwave transmitters to excite the multiple transverse modes, a difference in length of the adjacent waveguides is set to be a one-half guided wavelength divided by the number of the corresponding longitudinal waveguides.

18. The microwave annealing process of claim 12, wherein the half-wave-rectified power supplies are twelve, and before the step of adjusting the value of the capacitance, the half-wave-rectified power supplies are powered by an industrial three-phase alternate-current power source having three connecting leads named R, S, and T, and connecting the three connecting leads in a delta type to generate six-phased powers named R-S, S-T, T-R, S-R, T-S, and R-T providing to six of the half-wave-rectified power supplies, and wherein the half-wave-rectified power supplies are powered by an industrial three-phase alternate-current power source having three connecting leads named R, S, and T, and connecting the three connecting leads to a common-point C on the three-phase AC power source i in an inverse-wye type to generate six-phased powers named R-C, S-C, T-C, C-R, C-S, and C-T providing to another six of the half-wave-rectified power supplies.

19. The microwave annealing process of claim 12, wherein the half-wave-rectified power supplies are twelve, and before the step of adjusting the value of the capacitance, the half-wave-rectified power supplies are powered by an industrial three-phase alternate-current power source connected in a delta type as well as in an inverse-wye type to generate twelve-phased powers named R-S, R-C, S-T, T-C, T-R, C-R, S-R, C-S, T-S, R-T, C-T providing to twelve of the half-wave-rectified power supplies.

20. The microwave annealing process of claim 12, wherein each of the capacitance is composed of a variable capacitance.

21. A manufactural process of a multi-mode microwave heating device comprising:
providing a microwave heating device including:
a heating chamber arranged having an accommodation space in which a holder is disposed, and the holder has a plane;
a plurality of microwave transmitters arranged outside the heating chamber to transmit microwaves into the heating chamber;
a plurality of half-wave-rectified power supplies arranged to connect the microwave transmitters, and the half-wave-rectified power supplies have capacitances; and
a plurality of longitudinal waveguides and a plurality of transverse waveguides installed in between the heating chamber and the microwave transmitters, wherein the directions of electric field polarization of the longitudinal waveguides are perpendicular to the plane of the holder, and the directions of electric field polarization of the transverse waveguides are parallel to the plane of the holder;
adjusting the value of the capacitance of at least one of the half-wave-rectified power supplies, such that the microwave power pulse bandwidth of the microwave transmitters are extended to produce a plurality of overlapped couplings, thereby multiplying microwave mode numbers; and
supplying power to the microwave transmitters by the half-wave-rectified power supplies so that the microwaves are guided into the heating chamber by the longitudinal waveguides and the transverse waveguides for exciting multiple microwave modes in the heating chamber.

22. The manufactural process of claim 21, wherein the longitudinal waveguides are divided into two sets with equal power, and the two divided sets are installed symmetrically connected to the heating chamber, such that the microwaves with out-of-phase electric fields are symmetrically guided into the heating chamber to excite multiple longitudinal-odd modes.

23. The manufactural process of claim 21, wherein the longitudinal waveguides are divided into two sets with equal power, and the two sets are installed symmetrically connected to the heating chamber, such that the microwaves with in-phase electric fields are symmetrically guided into the heating chamber to excite multiple longitudinal-even modes.

24. The manufactural process of claim 21, wherein the transverse waveguides are divided into two sets with equal power, and the two sets are installed symmetrically connected to the heating chamber, such that microwaves with out-of-phase electric fields are symmetrically guided into the heating chamber to excite multiple transverse-odd modes.

25. The manufactural process of claim 21, wherein the transverse waveguides are divided into two sets with equal power, and the two sets are installed symmetrically connected to the heating chamber, such that microwaves with in-phase electric fields are symmetrically guided into the heating chamber to excite multiple transverse-even modes.

26. The manufactural process of claim 21, wherein the longitudinal waveguides are spaced from each other by a fixed angle and installed in between the heating chamber and the corresponding microwave transmitters to excite the multiple longitudinal modes, a difference in length of the adjacent waveguides is set to be a one-half guided wavelength divided by the number of the corresponding longitudinal waveguides, and wherein the transverse waveguides are spaced from each other by a fixed angle and installed in between the heating chamber and the corresponding microwave transmitters to excite the multiple transverse modes, a difference in length of the adjacent waveguides is set to be a one-half guided wavelength divided by the number of the corresponding longitudinal waveguides.

27. The manufactural process of claim 21, wherein the half-wave-rectified power supplies are twelve, and before the step of adjusting the value of the capacitance, the half-wave-rectified power supplies are powered by an industrial three-phase alternate-current power source having three connecting leads named R, S, and T, and connecting the three connecting leads in a delta type to generate six-phased powers named R-S, S-T, T-R, S-R, T-S, and R-T providing to six of the half-wave-rectified power supplies, and wherein the half-wave-rectified power supplies are powered by an industrial three-phase alternate-current power source having three connecting leads named R, S, and T, and connecting the three connecting leads to a common-point C on the three-phase AC power source i in an inverse-wye type to generate six-phased powers named R-C, S-C, T-C, C-R, C-S, and C-T providing to another six of the half-wave-rectified power supplies.

28. The manufactural process of claim 21, wherein the half-wave-rectified power supplies are twelve, and before the step of adjusting the value of the capacitance, the half-wave-rectified power supplies are powered by an industrial three-phase alternate-current power source connected in a delta type as well as in an inverse-wye type to generate twelve-phased powers named R-S, R-C, S-T, S-C, T-C, T-R, C-R, S-R, C-S, T-S, R-T, C-T providing to twelve of the half-wave-rectified power supplies.

29. The manufactural process of claim 21, wherein each of the capacitance is composed of a variable capacitance.

* * * * *